(12) United States Patent
Lee et al.

(10) Patent No.: US 12,327,758 B2
(45) Date of Patent: Jun. 10, 2025

(54) METHOD FOR FABRICATING SEMICONDUCTOR DEVICE

(71) Applicant: SK hynix Inc., Gyeonggi-do (KR)

(72) Inventors: Nam Yeal Lee, Gyeonggi-do (KR); Seung Won Lee, Gyeonggi-do (KR); Dong Sub Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 765 days.

(21) Appl. No.: 17/544,516

(22) Filed: Dec. 7, 2021

(65) Prior Publication Data
US 2023/0005788 A1 Jan. 5, 2023

(30) Foreign Application Priority Data
Jun. 30, 2021 (KR) .................. 10-2021-0085732

(51) Int. Cl.
*H01L 21/768* (2006.01)
*H01L 21/311* (2006.01)
*H01L 23/522* (2006.01)

(52) U.S. Cl.
CPC .. *H01L 21/76816* (2013.01); *H01L 21/76804* (2013.01); *H01L 23/5226* (2013.01); *H01L 21/31144* (2013.01); *H01L 21/76843* (2013.01)

(58) Field of Classification Search
CPC ............. H01L 23/562; H01L 21/31053; H01L 21/31144; H01L 21/76224; H01L 21/76232; H01L 23/544; H01L 23/564; H01L 2223/54426; H01L 27/11551; H01L 27/11517; H01L 27/11563; H01L 27/11578; H01L 27/11524; H01L 27/11529; H01L 27/1157; H01L 21/76816; H01L 21/76804; H01L 23/5226; H01L 21/76843; H01L 21/76813; H01L 21/76808; H01L 21/76897; H01L 21/76895; H01L 21/0332; H01L 21/0337; H01L 21/76877; H10B 41/00; H10B 41/20; H10B 43/00; H10B 43/20
USPC .......... 257/324, E29.309; 438/261, 264, 268
See application file for complete search history.

(56) References Cited

U.S. PATENT DOCUMENTS

| | | | |
|---|---|---|---|
| 6,492,263 B1 * | 12/2002 | Peng ................... | H01L 21/7681 257/E21.579 |
| 7,807,567 B2 | 10/2010 | Kawano et al. | |
| 8,906,810 B2 | 12/2014 | Indrakanti et al. | |
| 10,332,787 B2 | 6/2019 | Wu et al. | |
| 2018/0374744 A1 * | 12/2018 | Wu ................... | H01L 21/76832 |
| 2020/0243373 A1 * | 7/2020 | Yang ................... | H01L 21/7681 |

* cited by examiner

*Primary Examiner* — Jonathan Han
(74) *Attorney, Agent, or Firm* — IP & T GROUP LLP

(57) ABSTRACT

A method for fabricating a semiconductor device includes: forming a dielectric layer over a substrate; forming a hole-shaped partial via in the dielectric layer; forming a line-shaped trench that partially overlaps with the partial via and has a greater line width than a line width of the partial via in the dielectric layer; forming a hole-shaped via that has a smaller line width than the line width of the partial via and penetrates the dielectric layer on a lower surface of the partial via; and gap-filling the via, the partial via and the trench with a conductive material, wherein a lower surface of the trench is positioned at a higher level than the lower surface of the partial via.

25 Claims, 30 Drawing Sheets

METHOD FOR FABRICATING SEMICONDUCTOR DEVICE

CROSS-REFERENCE TO RELATED APPLICATIONS

The present application claims priority of Korean Patent Application No. 10-2021-0085732, filed on Jun. 30, 2021, which is incorporated herein by reference in its entirety.

BACKGROUND

1. Field

Various embodiments of the present invention relate to a method for fabricating a semiconductor device, and more particularly, to a method for fabricating a semiconductor device including a metal line.

2. Description of the Related Art

As semiconductor devices are highly integrated, the width and contact area of a metal line decrease, which gradually increases the resistance of the metal line as well as contact resistance. Also, as the distance between the metal line and the contact plugs becomes narrower, there is an issue in that the parasitic capacitance caused by the dielectric layer between the metal line increases.

SUMMARY

Embodiments of the present invention are directed to a semiconductor device fabrication method capable of solving a problem of burying a metal line and preventing an increase in parasitic capacitance between metal lines.

In accordance with an embodiment of the present invention, a method for fabricating a semiconductor device includes: forming a dielectric layer over a substrate; forming a hole-shaped partial via in the dielectric layer; forming a line-shaped trench that partially overlaps with the partial via and has a greater line width than a line width of the partial via in the dielectric layer; forming a hole-shaped via that has a smaller line width than the line width of the partial via and penetrates the dielectric layer on a lower surface of the partial via; and gap-filling the via, the partial via and the trench with a conductive material, wherein a lower surface of the trench is positioned at a higher level than the lower surface of the partial via.

In accordance with another embodiment of the present invention, a method for fabricating a semiconductor device includes: forming a dielectric layer over a substrate; forming a line-shaped trench that extends in one direction in the dielectric layer; forming a hole-shaped partial via that overlaps with a portion of the trench and has a smaller line width than a line width of the trench in the dielectric layer on a lower surface of the trench; forming a hole-shaped via that penetrates the dielectric layer on a lower surface of the partial via and has a smaller line width than the line width of the partial via; and gap-filling the via, the partial via, and the trench with a conductive material.

In accordance with yet another embodiment of the present invention, a method for fabricating a semiconductor device includes: forming a dielectric layer over a substrate; forming a line-shaped trench that extends in one direction in the dielectric layer; forming a hole-shaped via that penetrates the dielectric layer on a lower surface of the trench and has a smaller line width than a line width of the trench; forming a partial via by increasing a line width of an upper portion of the via; and gap-filling the via, the partial via, and the trench with a conductive material.

These and other features and advantages of the present invention will become understood to those with ordinary skill in the art of the invention form the following figures and detailed description of the present disclosure.

DETAILED DESCRIPTION

Figure 1:
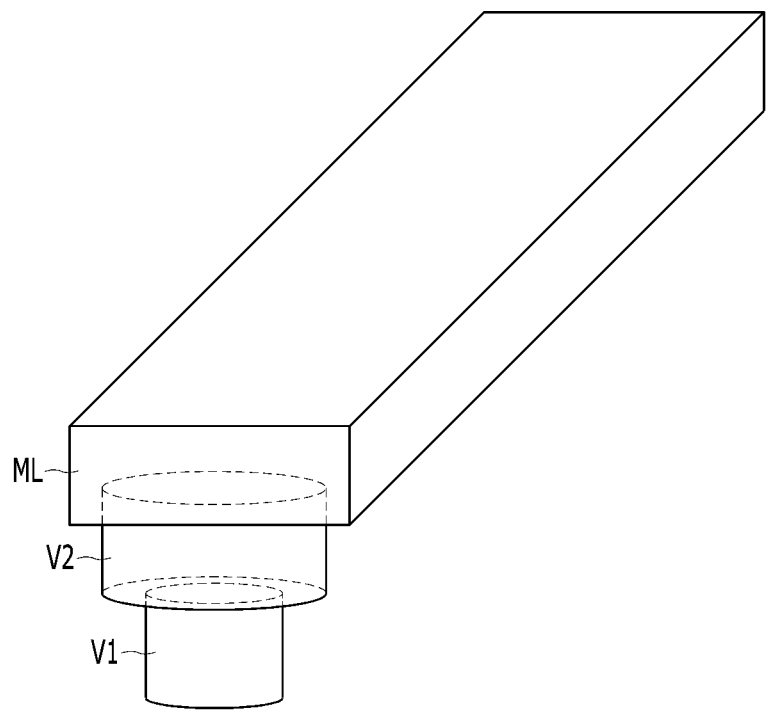
FIGS. 1 and 2 are perspective views illustrating a structure of a metal wiring line in a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
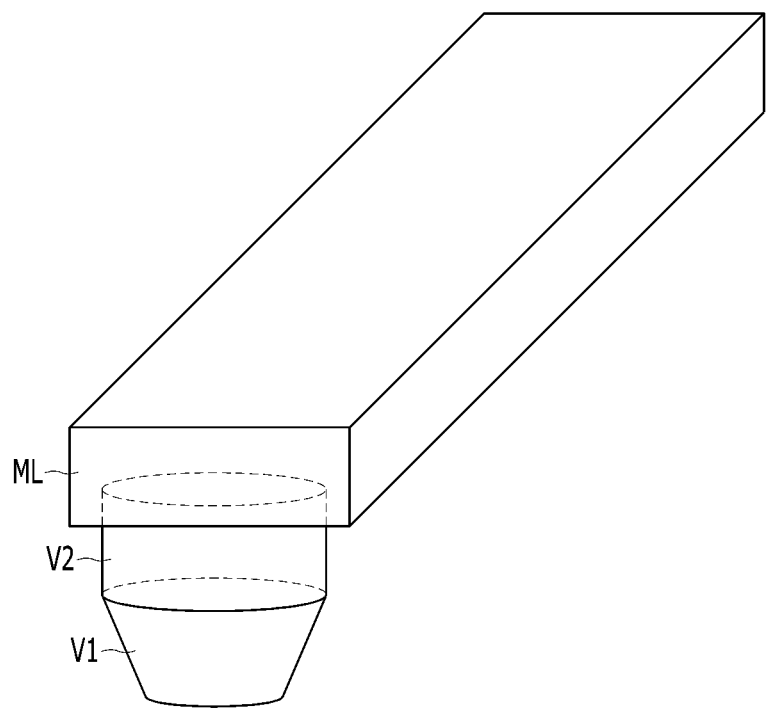

FIGS. 1 and 2 are perspective views illustrating a structure of a metal line in a semiconductor device in accordance with an embodiment of the present invention.

Referring to FIG. 1, the metal line ML may include a double via including a via V1 and a partial via V2 having different line widths from each other. The conductive material for the metal line may include, for example, copper (Cu). The metal line ML may have a line shape. The metal line ML may have a line shape extending in one direction. According to another embodiment of the present invention, the metal line ML may be formed in a different shape, e.g., spiral shape or a zigzag shape. The line width of the metal line ML may be greater than the line width of the via V1. The line width of the metal line ML may be the same as the line width of the partial via V2 or may be greater than the line width of the partial via V2. According to the embodiment of the present invention illustrated in FIG. 1, the line width of the metal line ML may be greater than the line width of the via V1 and also greater than the line width of the partial via V2, while the line width of the partial via V2 may be greater than the line width of the via V1.

The via V1 and the partial via V2 may be contacts for coupling the metal line ML and the lower layer and may overlap with a portion of the metal line ML. The stacked structure of the via V1 and the partial via V2 may have island shapes that are spaced apart from the neighboring stacked structures of the via V1 and the partial via and V2. The upper surface of the partial via V2 may contact the lower surface of the metal line ML, and the lower surface of the via V1 may contact the upper surface of the lower layer. The metal line ML may be electrically connected to the lower layer through the via V1 and the partial via V2. The via V1 and the partial via V2 may have different line widths. The line width of the via V1 may be smaller than the line width of the partial via V2. Each of the via V1 and the partial via V2 may have a cylindrical shape. According to another embodiment of the present invention, the via V1 and the partial via V2 may have a polygonal pillar shape, such as a quadrangular pillar shape.

According to the embodiment of the present invention, the line width increases as it goes from the via V1 toward the partial via V2, and to the metal line ML so as to form a stepped structure. In other words, by applying the partial via V2 whose line width is larger than the line width of the via V1 and smaller than the line width of the metal line ML between the via V1 and the metal line ML, the aspect ratio of the via may be reduced, and the contact area between the via and the metal line may be increased. Accordingly, it may be possible to secure a gap-fill margin when the conductive material for a metal line is filled, thereby improving the problem of voids being formed. Also, it may be possible to secure an overlap margin between the via and the metal line.

Furthermore, according to the embodiment of the present invention, the distance between the upper metal line ML and the lower metal line ML may be increased by applying a double via including the via V1 and the partial via V2 under the metal line ML. As a result, the parasitic capacitance between the upper metal line ML and the lower metal line ML may be improved, which may lead to improvement in the memory operation characteristics.

Referring to FIG. 2, the metal line ML may include a partial via V2 which is in contact with the metal line ML and a via V1. The Via V1 may have an upper surface having a line width different from that of its lower surface. The conductive material for the metal line ML may include, for example, copper (Cu). The metal line ML may have a line shape. The metal line ML may have a line shape extending in one direction. According to another embodiment of the present invention, the metal line ML may be formed in a different shape e.g., a spiral or zigzag shape, etc. as may be needed. The line width of the metal line ML may be at least greater than the line width of the lower surface of the via V1. The line width of the metal line ML may be the same as the line width of the partial via V2 or may be larger than the line width of the partial via V2. According to the embodiment of the present invention, the line width of the metal line ML may be larger than the line widths of the via V1 and the partial via V2.

The via V1 and the partial via V2 may be contacts for coupling the metal line and the lower layer and may overlap with a portion of the metal line. The stacked structure of the via V1 and the partial via V2 may have island shapes that are spaced apart from the neighboring stacked structures of the via V1 and the partial via V2. The upper surface of the partial via V2 may contact the lower surface of the metal line ML, and the lower surface of the via V1 may contact the upper surface of the lower layer. The metal line ML may be electrically connected to the lower layer by the via V1 and the partial via V2. The via V1 and the partial via V2 may have different line widths. The via V1 may have an upper surface whose line width is different from that of the lower surface of the via V1. The line width of the lower surface of the via V1 may be smaller than the line width of the upper surface of the via V1. The line width of the upper surface of the via V1 may be the same as the line width of the partial via V2. In other words, the via V1 whose line width decreases as it goes from top to bottom and the partial via V2 having the same line widths in the upper and lower portions may together have a 'glass shape' with a cut cone lower section and a cylindrical upper section.

According to another embodiment of the present invention, the line width of the upper surface of the via V1 may be smaller than the line width of the partial via V2. The via V1 may have a cut cone shape having different upper surface and lower surface diameters. In an embodiment both the via V1 and the partial via V2 may have a cylindrical shape or a cut cone shape. According to another embodiment of the present invention, the via V1 and the partial via V2 may have a rectangular pillar shape. According to another embodiment of the present invention, the via V1 may have a cylindrical shape whose line widths of the upper surface and the lower surface are the same, and the partial via V2 may include a cut cone shape whose line widths of the upper surface and the lower surface are different. The line width of the lower surface of the partial via V2 may be the same as the line width of the via V1 or may be larger than the line width of the via V1, and the line width of the upper surface of the partial via V2 may be larger than the line width of the lower surface of the partial via V2. The line width of the upper surface of the partial via V2 may be the same as the line width of the metal line ML or may be smaller than the line width of the metal line ML. According to yet another embodiment of the present invention, both of the via V1 and the partial via V2 may have a cut cone shape whose line width of the upper surface is different from the line width of the lower surface. The concept and spirit of the embodiment of the present invention are not limited thereto, and the embodiment of the present invention may include a structure whose line width is gradually increased as it goes up from the via V1 to the metal line ML.

According to the embodiment of the present invention, the line width may be gradually and or stepwisely increased as it goes up from a lower surface of the via V1 first toward the partial via V2, and then the metal line ML. In other words, by applying a partial via V2 whose line width is larger than the line width of the lower surface of the via V1 and smaller than the line width of the metal line ML between the via V1 and the metal line ML, the aspect ratio of the via V1 may be decreased and the contact area between the via V1 and the metal line ML may be increased. Accordingly, it may be possible to secure a gap-fill margin when a conductive material for the metal line ML is filled, thereby improving the problem of voids being formed. Also, it may be possible to secure an overlap margin between the via V1 and the metal line ML.

Furthermore, according to the embodiment of the present invention, by applying a double via including the via V1 and the partial via V2 under the metal line ML, the distance between the upper metal line ML and the lower metal line ML may be increased. Accordingly, the parasitic capacitance between the upper metal line ML and the lower metal line ML may be improved, which may lead to improvement in the memory operation characteristics.

FIGS. 3A to 3G are cross-sectional views illustrating an embodiment of a method for fabricating the semiconductor device shown in FIG. 1.

Figure 3A:
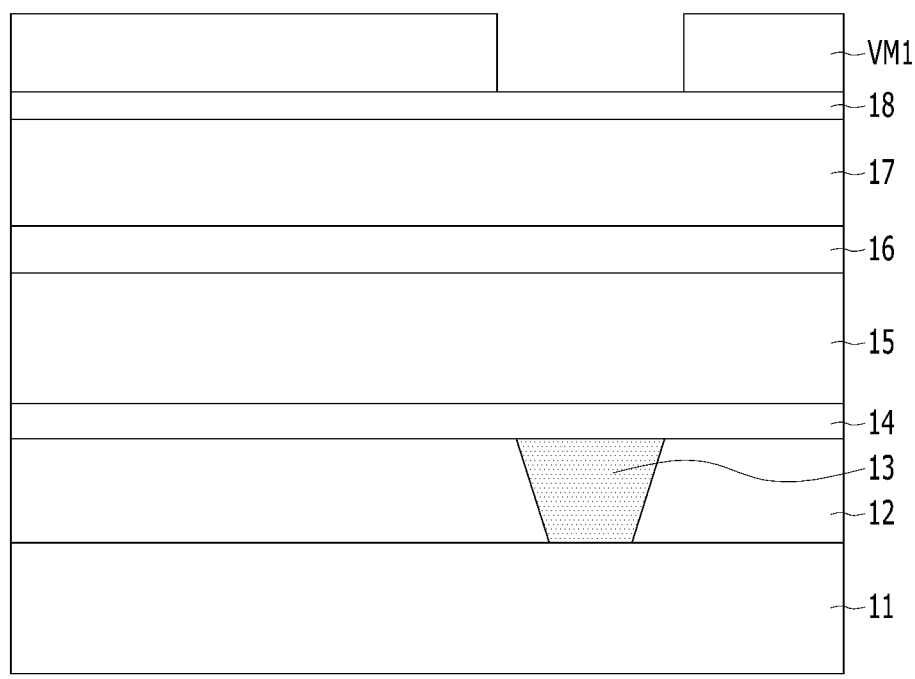
FIGS. 3A to 3G are cross-sectional views illustrating an embodiment of a method for fabricating the semiconductor device shown in FIG. 1.
Figure 3B:
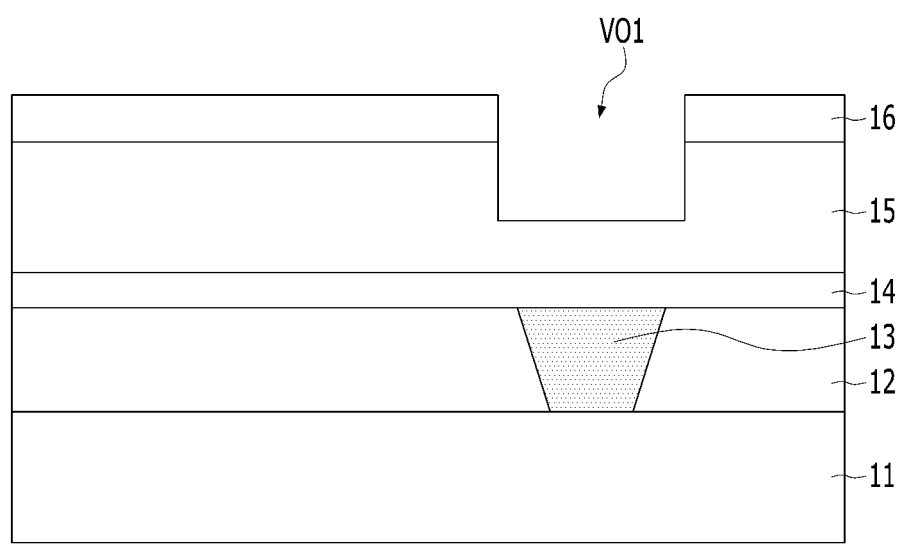

Referring to FIGS. 3A and 3B, a first dielectric layer 12 including a buried first metal line 13 may be formed over a semiconductor substrate 11.

The semiconductor substrate 11 may be a semiconductor substrate in which lower structures such as a gate, a bit line, and a capacitor are formed. The semiconductor substrate 11 may be formed of a material containing silicon. The semiconductor substrate may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In an embodiment, the semiconductor substrate 11 may include a III/V semiconductor substrate, for example, a compound semiconductor substrate such as gallium arsenium (GaAs). In an embodiment, the semiconductor substrate 11 may include a Silicon-On-Insulator (SOI) substrate.

The first dielectric layer 12 may be formed at least one of silicon oxide, silicon nitride, and low-k materials including silicon carbon and boron.

The first metal line 13 may include a conductive material. The first metal line 13 may include a metal material. For example, the first metal line 13 may include, for example, tungsten, copper, or aluminum.

Subsequently, an etch stop layer 14 may be formed over the first dielectric layer 12 and the first metal line 13. The etch stop layer 14 may also serve as a barrier to prevent diffusion of the first metal line 13. The etch stop layer 14 may include, for example, silicon nitride or silicon carbon.

Subsequently, a second dielectric layer 15 may be formed over the etch stop layer 14. The thickness of the second dielectric layer 15 may be greater than the thickness of the etch stop layer 14. The second dielectric layer 15 may be made of a low-k dielectric material having a low dielectric constant. The second dielectric layer 15 may be made of a dielectric material having a lower dielectric constant than that of silicon oxide ($SiO_2$), preferably a material having a dielectric constant of approximately 3.5 or less. The second dielectric layer 15 may include a low-k material containing carbon. The second dielectric layer 15 may include silicon oxide containing carbon and hydrogen. The second dielectric layer 15 may be, for example, a SiCOH dielectric layer. SiCOH is a mixture of Si, C, O, and H, whose dielectric constant decreases as it contains more hydrogen (H) or carbon (C), which are atoms with a low electrical polarity in a film.

Subsequently, first and second hard masks 16 and 17 may be formed sequentially over the second dielectric layer 15 in the recited order. The first and second hard masks 16 and 17 may be made of a material having an etch selectivity with respect to the second dielectric layer 15. The first and second hard masks 16 and 17 may include an easily removable material. The first and second hard masks 16 and 17 may be formed of materials having different etch selectivities. For example, the first hard mask 16 may include tetra ethyl ortho silicate (TEOS), and the second hard mask 17 may include Spin-On-Carbon (SOC). The first and second hard masks 16 and 17 may have different thicknesses. The thickness of the first hard mask 16 may be smaller than the thickness of the second dielectric layer 15 and also than the thickness of the second hard mask 17.

Subsequently, a first anti-reflection layer 18 and a first via mask VM1 may be formed over the second hard mask 17. The first anti-reflection layer 18 may be formed over the second hard mask 17. The first via mask VM1 may be formed over the first anti-reflection layer 18.

The first anti-reflection layer 18 may include a material having an etch selectivity with respect to the first and second hard masks 16 and 17. The first anti-reflection layer 18 may include, for example, silicon oxynitride (SiON). The first via mask VM1 may define a region in which a partial via is to be formed, and it may be patterned in a hole shape.

Subsequently, a partial via VO1 may be formed in the second dielectric layer 15. The partial via VO1 may be selectively formed only in a contact coupling portion for coupling lines. The partial via VO1 may be formed by etching the second dielectric layer 15 to a predetermined depth. The partial via VO1 may be formed through a series of processes of sequentially etching the first anti-reflection layer 18, the second hard mask 17, and the first hard mask 16 by using the first via mask VM1, and then etching the second dielectric layer 15 to a predetermined depth by using the etched second and first hard masks 17 and 16 as an etch barrier. The first via mask VM1 and the first anti-reflection layer 18 may be removed after the first and second hard masks 16 and 17 are etched, or they may be removed after the partial via VO1 is formed. The second hard mask 17 may be removed after the partial via VO1 is formed.

Figure 3C:
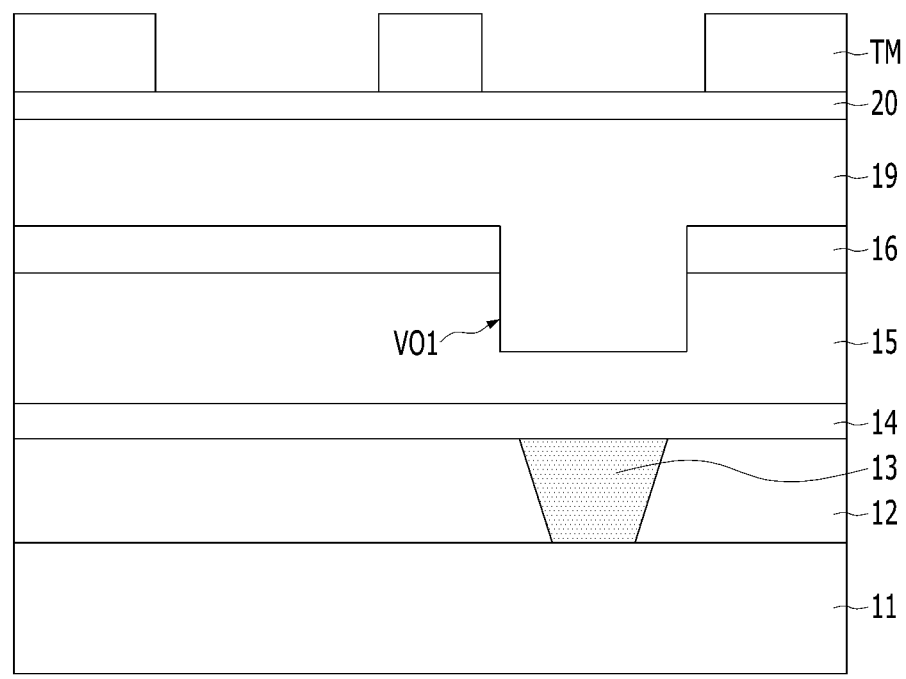
Figure 3D:
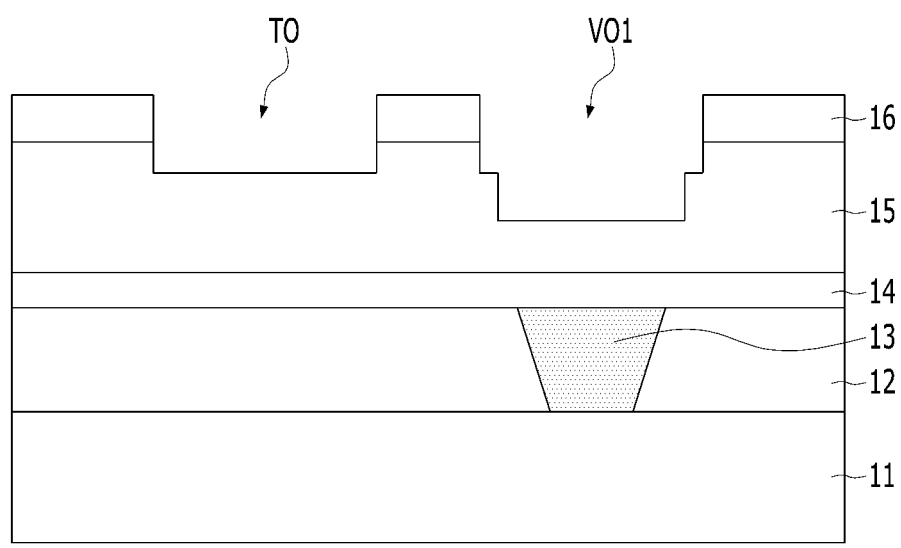

Referring to FIGS. 3C and 3D, a third hard mask 19, a second anti-reflection layer 20, and a trench mask TM may be sequentially formed over the partial via VO1 and the first hard mask 16 in the recited order. The third hard mask 19 may include the same material as that of the second hard mask 17 (refer to FIG. 3A). For example, the third hard mask 19 may include a spin-on-carbon (SOC). The thickness of the third hard mask 19 may be greater than the thickness of the first hard mask 16.

The second anti-reflection layer 20 may include a material having an etch selectivity with respect to the third hard mask 19. The second anti-reflection layer 20 may include, for example, silicon oxynitride (SiON). The first via mask VM1 may include a photoresist. The trench mask TM may define a region where a metal line is to be formed. The trench mask TM may be patterned in a line shape extending in one direction. The area defined by the trench mask TM may partially overlap with the partial via V01. The line width of the region defined by the trench mask TM may be adjusted to be greater than the line width of the partial via VO1, but the concept and spirit of the present invention are not limited thereto.

Subsequently, a plurality of trenches TO may be formed in the second dielectric layer 15. The trenches TO may be regions where the second metal line is to be formed, and some of the trenches TO may overlap with the partial via VO1. The lower surface of the trenches TO may be positioned at a higher level than the lower surface of the partial via VO1. In other words, the depth of the trench TO may be adjusted to be lower than the depth of the partial via VO1.

The trenches TO may be formed through a series of processes of sequentially etching the second anti-reflection layer 20 and the third hard mask 19 by using the trench mask TM, and then etching the second dielectric layer 15 to a predetermined depth such that the lower surface of the trenches 15 is higher than the lower surface of the partial via VO1 by using the etched third hard mask 19 as an etch barrier. Also, the lower surface of the second dielectric layer 15 is lower than the lower surface of the partial Via VO1. The trench mask TM and the second anti-reflection layer 20 may be removed after the third hard mask 19 is etched, or they may be removed after the trenches TO are formed. The third hard mask 19 may be removed after the trenches TO are formed.

Figure 3E:
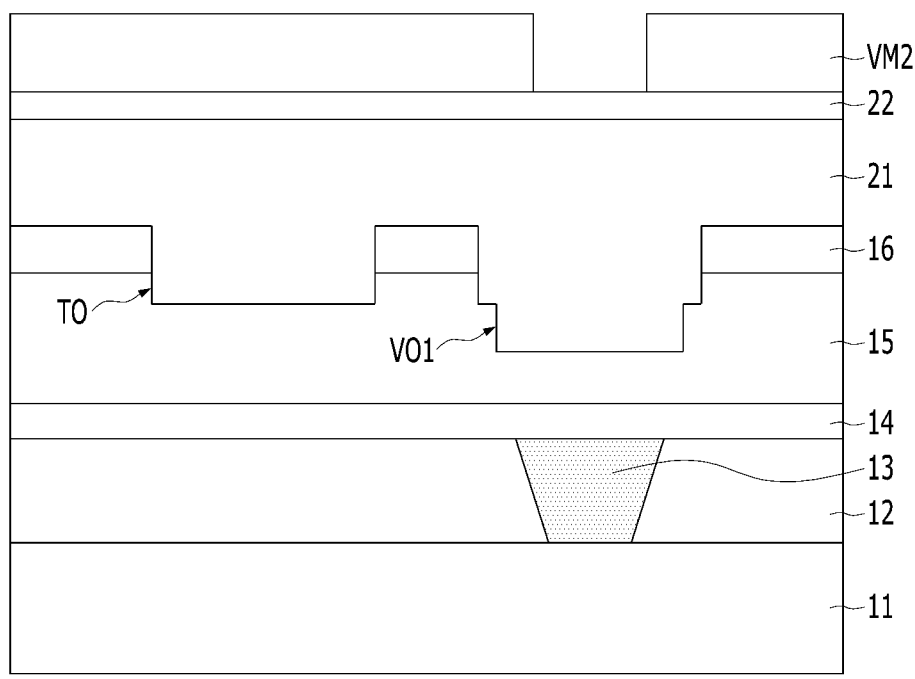
Figure 3F:
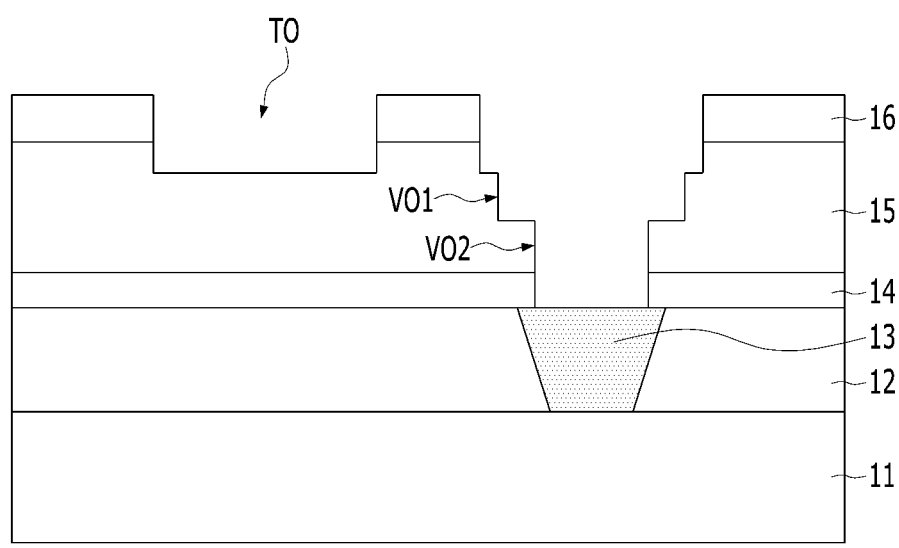

Referring to FIGS. 3E and 3F, a fourth hard mask 21, a third anti-reflection layer 22, and a second via mask VM2 may be sequentially formed over the partial via VO1, the trench TO, and the first hard mask 16 in the recited order. The fourth hard mask 21 may include the same material as that of the second hard mask 17 (refer to FIG. 3A). The fourth hard mask 21 may include a spin-on-carbon (SOC). The thickness of the fourth hard mask 21 may be greater than the thickness of the first hard mask 16.

The third anti-reflection layer 22 may include a material having an etch selectivity with respect to the fourth hard mask 21. The third anti-reflection layer 22 may include, for example, silicon oxynitride (SiON). The second via mask VM2 may include a photoresist. The second via mask VM2 may define a region where a via is to be formed. The second via mask VM2 may be patterned in a hole pattern to form a hole. The area defined by the second via mask VM2 may overlap with the partial via VO1. The line width of the region defined by the second via mask VM2 may be smaller than the line width of the partial via VO1.

Subsequently, a via VO2 exposing the upper surface of the first metal line 13 may be formed on the lower surface of the partial via VO1. The via VO2 may serve as a contact for coupling a line to a line together with the partial via VO1. The via VO2 may be formed only on the lower surface of the partial via VO1. The via VO2 may be formed with a line width smaller than the line width of the partial via VO1.

The via VO2 may be formed through a series of processes of sequentially etching the third anti-reflection layer 22 and the fourth hard mask 21 by using the second via mask VM2, and then etching the second dielectric layer 15 on the lower surface of the partial via VO1 by using the etched fourth hard mask 21 as an etch barrier. The second via mask VM2 and the third anti-reflection layer 22 may be removed after the fourth hard mask 21 is etched, or they may be removed after the via VO2 is formed. The fourth hard mask 21 may be removed after the via VO2 is formed. The via VO2 and the partial via VO1 may be referred to as a 'double via'. The double via may also be referred to as a 'metal line contact hole' that couples between metal lines.

The line width of the via VO2 may be smaller than the line width of the partial via VO1. The line width of the partial via VO1 may be smaller than the line width of the trench TO. In other words, the line width may increase in a stepwise manner as it goes from the via VO2 to the partial via VO1 and to the trench TO, thus, forming a stepped structure.

Figure 3G:
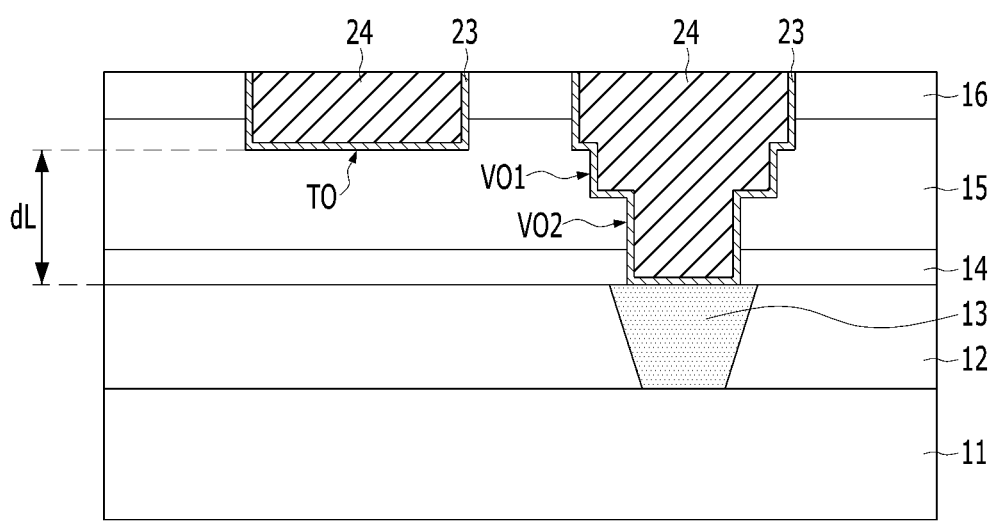

Referring to FIG. 3G, a second metal line 24 may be formed. The second metal line 24 may be formed through a series of processes of forming a barrier layer 23 on the profile of the second dielectric layer 15 including the via VO2, the partial via VO1, and the trench TO, forming a conductive material that fills the via VO2, the partial via VO1, and the trench TO over the barrier layer 23, and then etching the conductive material and the barrier layer 23 such that the upper surface of the second dielectric layer 15 is exposed. In this case, the process of etching the conductive material and the barrier layer 23 may be performed by Chemical Mechanical Polishing (CMP) or an etch-back process.

The barrier layer 23 may serve to prevent diffusion of the second metal line 24. The barrier layer 23 may be formed of at least one material selected from the group including Ta, TaN, TiN, WN, and W—Si—N. The second metal line 24 may include, for example, tungsten, copper, or aluminum.

According to the embodiment of the present invention, the line width may be gradually increased as it goes up toward the via VO2, the partial via VO1, and the trench TO. In other words, by applying a partial via VO1 whose line width is larger than the line width of the via VO2 and smaller than the line width of the trench TO between the via VO2 and the trench TO, the aspect ratio of the via may be decreased and the contact area between the via and the metal line may be increased. As a result, it may be possible to secure a gap-fill margin when the conductive material for the metal line ML is filled, thereby improving the problem of voids being formed. Also, it may be possible to secure an overlap margin between the via VO2 and the metal line ML.

Furthermore, according to the embodiment of the present invention, by applying a double via including the via VO2 and the partial via VO1 under the second metal line 24, the distance dL from the first metal line 13 may be increased. Accordingly, parasitic capacitance between the first metal line 13 and the second metal line 24 may be improved, which may lead to improvement in memory operation characteristics.

FIGS. 4A to 4G are cross-sectional views illustrating another embodiment of a method for fabricating the semiconductor device shown in FIG. 1.

Figure 4A:
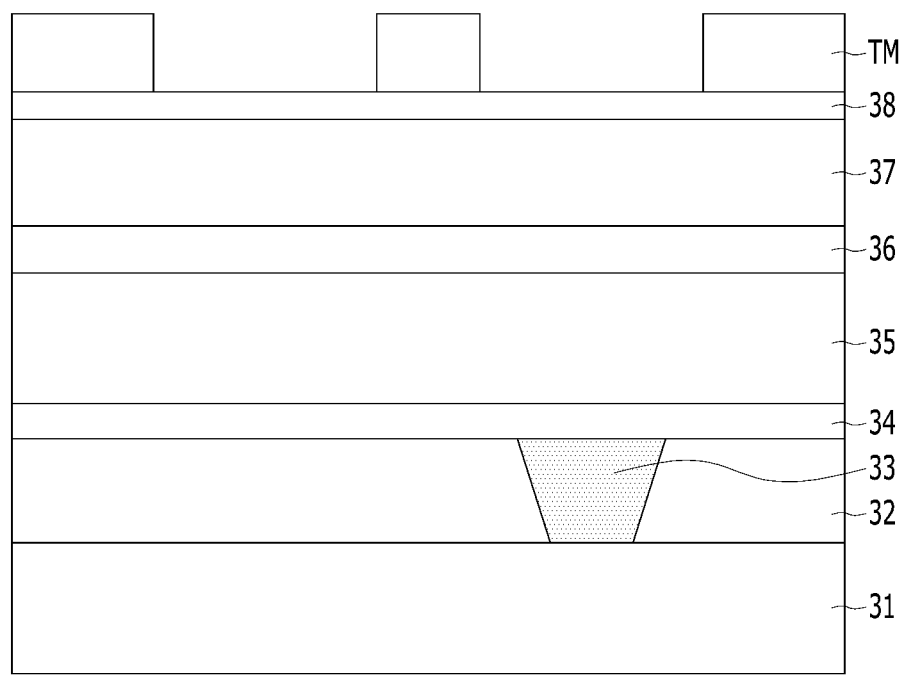
FIGS. 4A to 4G are cross-sectional views illustrating another embodiment of a method for fabricating the semiconductor device shown in FIG. 1.
Figure 4B:
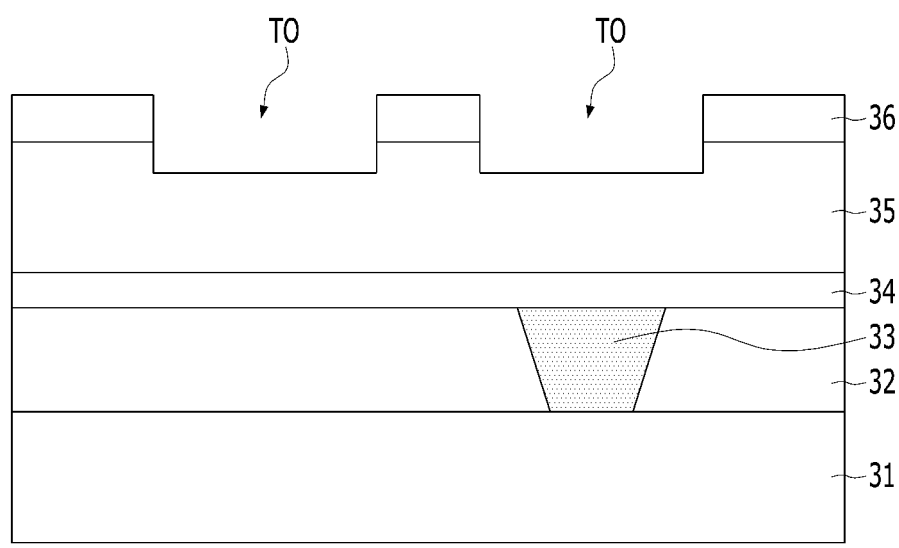

Referring to FIGS. 4A and 4B, a first dielectric layer 32 in which the buried first metal line 33 may be formed over the semiconductor substrate 31.

The semiconductor substrate 31 may be a semiconductor substrate in which a lower structure (not shown) such as a gate, a bit line, and a capacitor is formed. The semiconductor substrate 31 may be formed, for example, of a material containing silicon. The semiconductor substrate 31 may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In an embodiment, the semiconductor substrate 31 may include a III/V group semiconductor substrate, for example, a compound semiconductor substrate, such as GaAs. In an embodiment, the semiconductor substrate 31 may include a silicon-on-insulator (SOI) substrate.

The first dielectric layer 32 may be formed at least one of silicon oxide, silicon nitride, and low-k materials including silicon carbon and boron.

The first metal line 33 may include a conductive material. The first metal line 33 may include a metal material. The first metal line 33 may include, for example, tungsten, copper, or aluminum.

Subsequently, an etch stop layer 34 may be formed over the first dielectric layer 32 and, also, over the first metal line 33. The etch stop layer 34 may also serve as a barrier to prevent diffusion of the first metal line 33. The etch stop layer 34 may include, for example, silicon nitride or silicon carbon.

Subsequently, a second dielectric layer 35 may be formed over the etch stop layer 34. The thickness of the second dielectric layer 35 may be greater than the thickness of the etch stop layer 34. The second dielectric layer 35 may be a low-k dielectric material having a low dielectric constant. The second dielectric layer 35 may be a dielectric material having a lower dielectric constant than that of silicon oxide ($SiO_2$), preferably a material having a dielectric constant of approximately 3.5 or less. The second dielectric layer 35 may include a low-k material containing carbon. The second dielectric layer 35 may include silicon oxide containing carbon and hydrogen. The second dielectric layer 35 may be, for example, SiCOH. SiCOH is a mixture of Si, C, O, and H, and is a material whose dielectric constant decreases as it contains more hydrogen (H) or carbon (C), which are atoms with a low electrical polarity in a film.

Subsequently, first and second hard masks 36 and 37 may be formed over the second dielectric layer 35. The first and second hard masks 36 and 37 may include a material having an etch selectivity with respect to the second dielectric layer 35. The first and second hard masks 36 and 37 may include an easily removable material. The first and second hard masks 36 and 37 may be formed of materials having different etch selectivities. For example, the first hard mask 36 may include tetra ethyl ortho silicate (TEOS), and the second hard mask 36 may include a spin-on-carbon (SOC). The first and second hard masks 36 and 37 may have different thicknesses. The thickness of the first hard mask 36 may be smaller than the thicknesses of the second dielectric layer 35 and the second hard mask 37.

Subsequently, a first anti-reflection layer 38 and a trench mask TM may be formed over the second hard mask 37. The first anti-reflection layer 38 may include a material having an etch selectivity with respect to the first and second hard masks 36 and 37. The first anti-reflection layer 38 may include, for example, silicon oxynitride (SiON). The trench mask TM may include a photoresist. The trench mask TM may define a region in which a metal line is to be formed, and may be patterned in a line shape extending in one direction.

Subsequently, a plurality of trenches TO may be formed in the second dielectric layer 35. The trenches TO may be the region where a second metal line is formed and may be formed by etching the second dielectric layer 35 to a predetermined depth. The trenches TO may be formed through a series of processes of sequentially etching the first anti-reflection layer 38, the second hard mask 37, and the first hard mask 36 by using the trench mask TM and etching the second dielectric layer 35 to a predetermined depth by using the etched second and first hard masks 37 and 36 as an etch barrier. The trench mask TM and the first anti-reflection layer 38 may be removed after the first and second hard masks 36 and 37 are etched, or they may be removed after the trenches TO are formed. The second hard mask 37 may be removed after the trenches TO are formed.

Figure 4C:
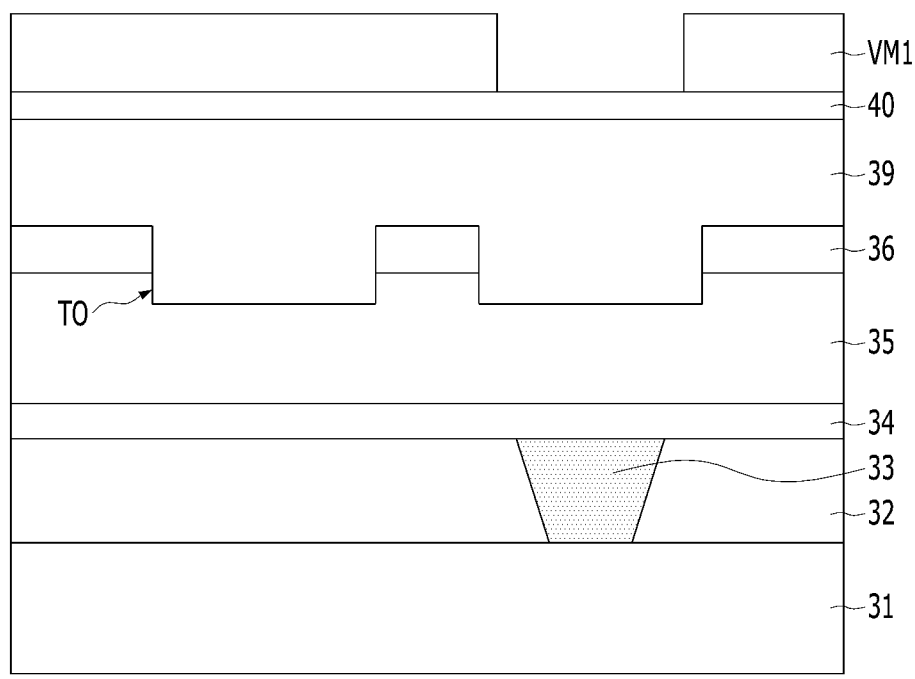
Figure 4D:
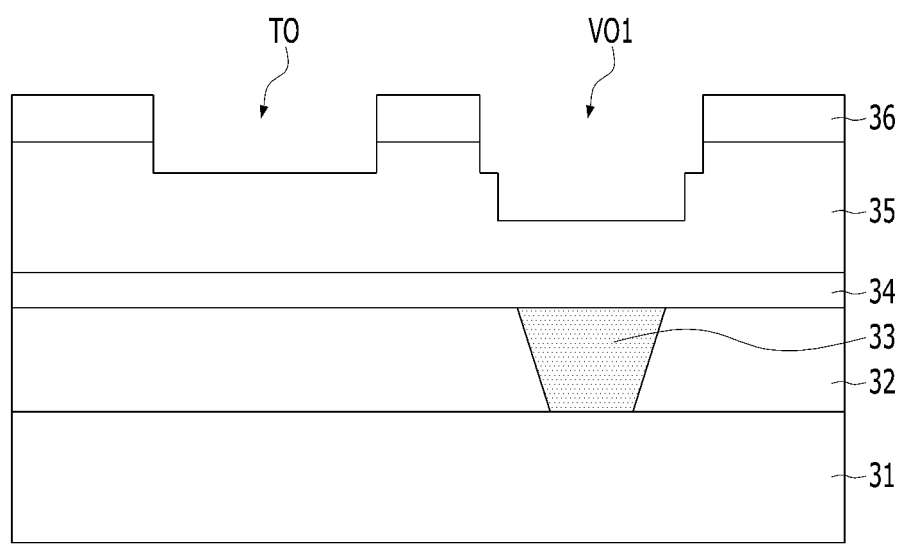

Referring to FIGS. 4C and 4D, a third hard mask 39, a second anti-reflection layer 40, and a first via mask VM1 may be sequentially formed over the trenches TO and the first hard mask 36. The third hard mask 39 may include the same material as that of the second hard mask 37 (refer to FIG. 4A). The third hard mask 39 may include a spin-on-carbon (SOC). The thickness of the third hard mask 39 may be greater than the thickness of the first hard mask 36.

The second anti-reflection layer 40 may include a material having an etch selectivity with respect to the third hard mask 39. The second anti-reflection layer 40 may include, for example, silicon oxynitride (SiON). The first via mask VM1 may include a photoresist. The first via mask VM1 may define a region in which a partial via is to be formed, and may be patterned in a hole shape to form a hole. The region defined by the first via mask VM1 may overlap with a portion of the trench TO. The line width of the region defined by the first via mask VM1 may be smaller than the line width of the trench TO.

Subsequently, a partial via VO1 may be formed on the lower surface of the trench TO. The partial via VO1 may be selectively formed only in a contact coupling portion for coupling a line to a line. The partial via VO1 may be formed only on the lower surface of the partial trench TO. The partial via VO1 may be formed to have a smaller line width than that of the trench TO. The partial via VO1 may be formed through a series of processes of sequentially etching the second anti-reflection layer 40 and the third hard mask 39 by using the first via mask VM1, and then etching the second dielectric layer 35 on the lower surface of the trench to a predetermined depth by using the etched third hard mask 39 as an etch barrier. The first via mask VM1 and the second anti-reflection layer 40 may be removed after the third hard mask 39 is etched, or they may be removed after the partial via VO1 is formed. The third hard mask 39 may be removed after the partial via VO1 is formed.

Figure 4E:
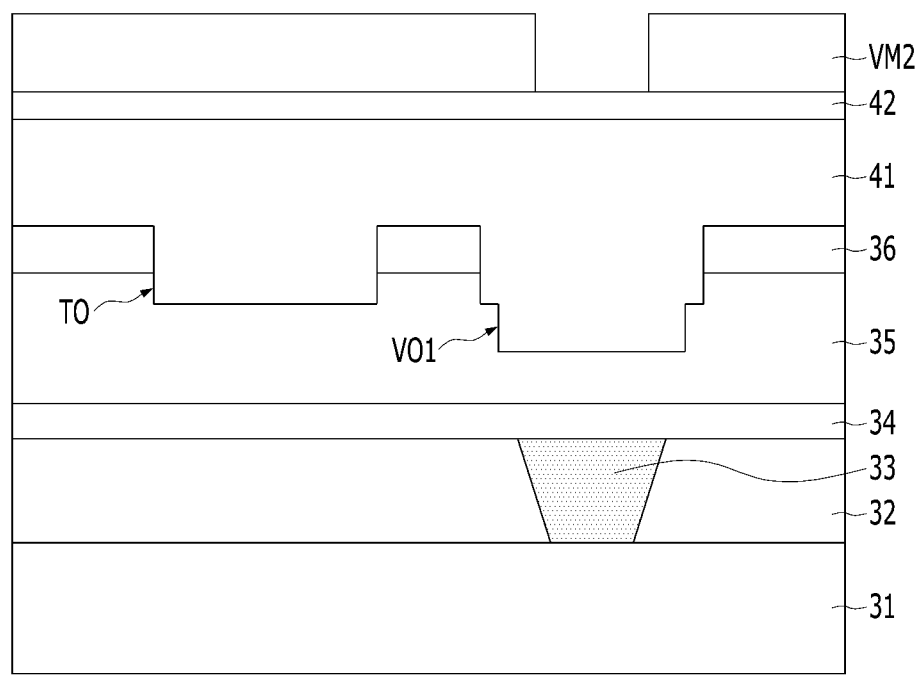
Figure 4F:
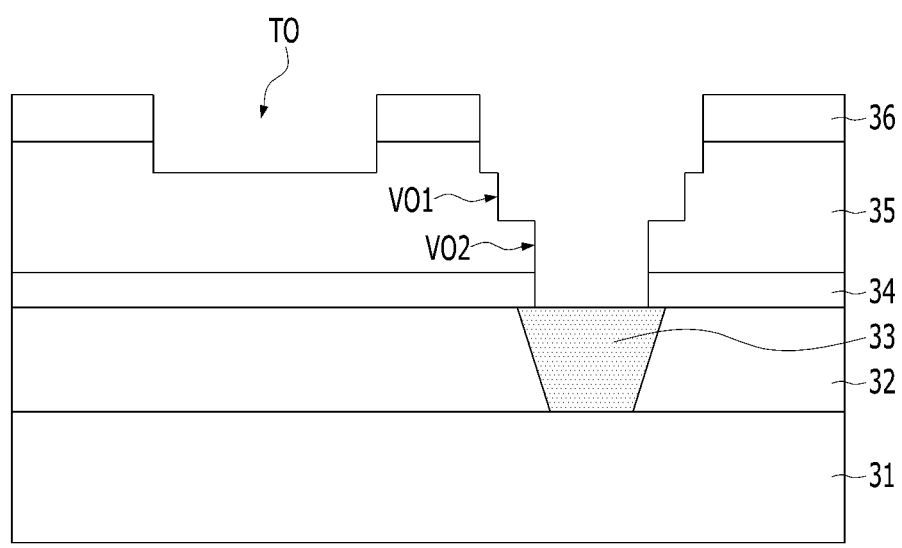

Referring to FIGS. 4E and 4F, a fourth hard mask 41, a third anti-reflection layer 42, and a second via mask VM2 may be sequentially formed over the partial via VO1 and the first hard mask 36. The fourth hard mask 41 may include the same material as that of the second hard mask 37 (refer to FIG. 4A). The fourth hard mask 41 may include a spin-on-carbon (SOC). The thickness of the fourth hard mask 41 may be greater than the thickness of the first hard mask 36.

The third anti-reflection layer 42 may include a material having an etch selectivity with respect to the fourth hard mask 41. The third anti-reflection layer 42 may include, for example, silicon oxynitride (SiON). The second via mask VM2 may include a photoresist. The second via mask VM2 may define a region in which a via is to be formed, and may be patterned in a hole shape to form a hole. The area defined by the second via mask VM2 may overlap with the partial via VO1. The line width of the region defined by the second via mask VM2 may be smaller than the line width of the partial via VO1.

Subsequently, a via VO2 exposing the upper surface of the first metal line 33 may be formed on the lower surface of the partial via VO1. The via VO2 may serve as a contact for coupling a line to a line together with the partial via VO1. The via VO2 may be formed only on the lower surface of the partial via VO1. In other words, the via VO2 may be formed only on the lower surface of some trenches TO. The via VO2 may be formed to have a smaller line width than the line width of the partial via VO1. The via VO2 may be formed through a series of processes of sequentially etching the third anti-reflection layer 42 and the fourth hard mask 41 by using the second via mask VM2, and then etching the second dielectric layer 35 on the lower surface of the partial via VO1 by using the etched fourth hard mask 41 as an etch barrier. The second via mask VM2 and the third anti-reflection layer 42 may be removed after the fourth hard mask 41 is etched, or they may be removed after the via VO2 is formed.

The fourth hard mask 41 may be removed after the via VO2 is formed. The via VO2 and the partial via VO1 may be referred to as a 'double via'. The double via may be referred to as a 'metal line contact hole' that connects between metal lines.

The line width of the via VO2 may be smaller than the line width of the partial via VO1. The line width of the partial via VO1 may be smaller than the line width of the trench TO. In other words, the line width may increase in a stepwise manner from the via VO2 to the trench TO, thus forming a stepped structure.

Figure 4G:
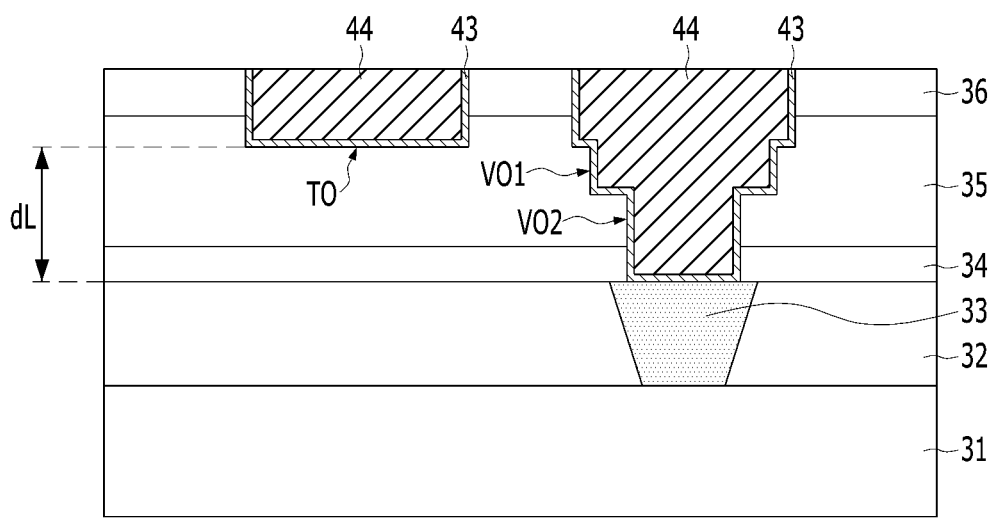

Referring to FIG. 4G, a second metal line 44 may be formed. The second metal line 44 may be formed through a series of forming a barrier layer 43 on the profile of the second dielectric layer 35 including the via VO2, the partial via VO1, and the trench TO, forming a conductive material that fills the via VO2, the partial via VO1, and the trench TO over the barrier layer 43, and etching the conductive material and the barrier layer 43 such that the upper surface of the second dielectric layer 35 is exposed. In this case, the process of etching the conductive material and the barrier layer 43 may be performed by Chemical Mechanical Polishing (CMP) or an etch-back process.

The barrier layer 43 may serve to prevent diffusion of the second metal line 44. The barrier layer 43 may be formed of at least one material selected from the group including Ta, TaN, TiN, WN, and W—Si—N. The second metal line 44 may include, for example, tungsten, copper, or aluminum.

According to the embodiment of the present invention, the line width may be gradually increased as it goes up toward the via VO2, the partial via VO1, and the trench TO. In other words, by applying a partial via VO1 whose line width is larger than the line width of the via VO2 and smaller than the line width of the trench TO between the via VO2 and the trench TO, the aspect ratio of the via may be decreased and the contact area between the via and the metal line may be increased. As a result, it may be possible to secure a gap-fill margin when the conductive material for the metal line ML is filled, thereby improving the problem of voids being formed. Also, it may be possible to secure an overlap margin between the via VO2 and the metal line ML.

Furthermore, according to the embodiment of the present invention, by applying a double via including the via VO2 and the partial via VO1 under the second metal line 44, the distance dL from the first metal line 33 may be increased. Accordingly, parasitic capacitance between the first metal line 33 and the second metal line 44 may be improved, which may lead to improvement in memory operation characteristics.

FIGS. 5A to 5G are cross-sectional views illustrating an embodiment of a method for fabricating the semiconductor device shown in FIG. 2.

Figure 5A:
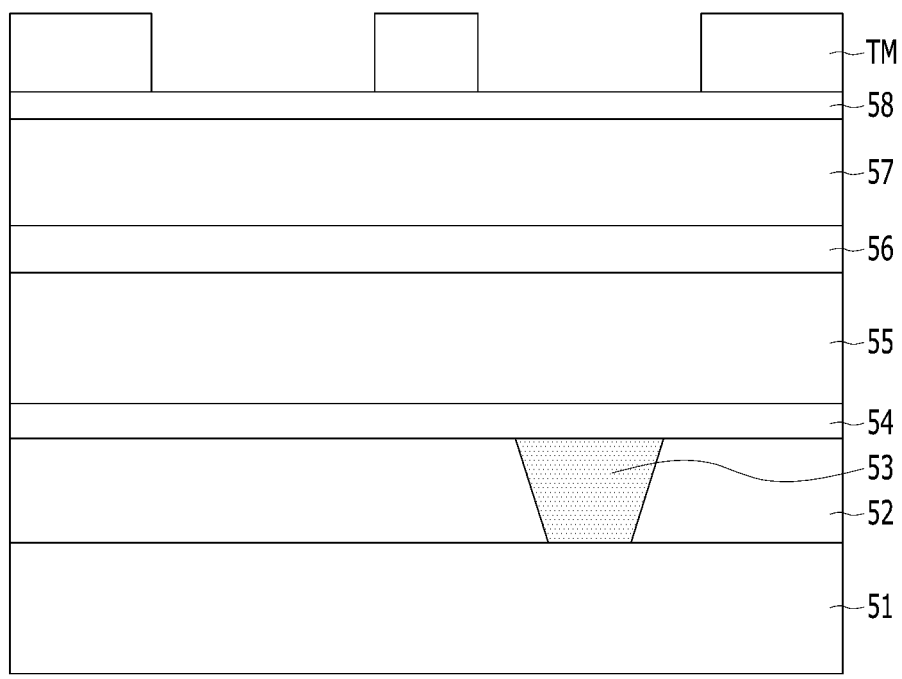
FIGS. 5A to 5G are cross-sectional views illustrating an embodiment of a method for fabricating the semiconductor device shown in FIG. 2.
Figure 5B:
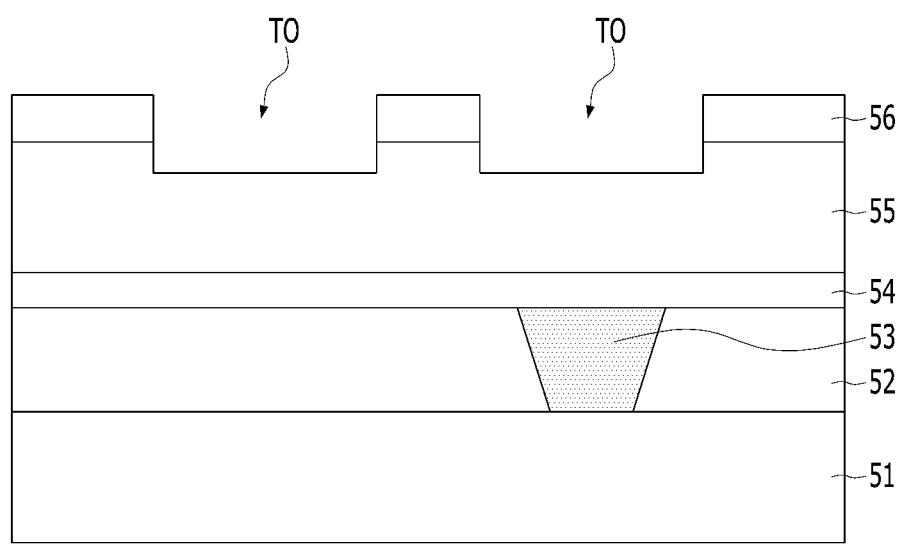

Referring to FIGS. 5A and 5B, a first dielectric layer 52 including a buried first metal line 53 may be formed over the semiconductor substrate 51.

The semiconductor substrate 51 may be a semiconductor substrate in which a lower structure (not shown) such as a gate, a bit line, and a capacitor is formed. The semiconductor substrate 51 may be formed of a material containing silicon. For example, the semiconductor substrate 51 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof.

In an embodiment, the semiconductor substrate 51 may include a III/V group semiconductor substrate, for example, a compound semiconductor substrate such as GaAs. The semiconductor substrate 51 may include a Silicon-On-Insulator (SOI) substrate.

The first dielectric layer 52 may be formed of at least one of silicon oxide, silicon nitride, and low-k materials including silicon carbon and boron.

The first metal line 53 may include a conductive material. The first metal line 53 may include a metal material. The first metal line 53 may include, for example, tungsten, copper, or aluminum.

Subsequently, an etch stop layer 54 may be formed over the first dielectric layer 52 including the first metal line 53. The etch stop layer 54 may also serve as a barrier to prevent diffusion of the first metal line 53. The etch stop layer 54 may include, for example, silicon nitride or silicon carbon.

Subsequently, a second dielectric layer 55 may be formed over the etch stop layer 54. The thickness of the second dielectric layer 55 may be greater than the thickness of the etch stop layer 54. The second dielectric layer 55 may be of a low-k dielectric material having a low dielectric constant. The second dielectric layer 55 may be a dielectric material having a lower dielectric constant than that of silicon oxide ($SiO_2$), preferably a material having a dielectric constant of approximately 3.5 or less. The second dielectric layer 55 may include a low-k material containing carbon. The second dielectric layer 55 may include silicon oxide containing carbon and hydrogen. The second dielectric layer 55 may be, for example, SiCOH. SiCOH is a mixture of Si, C, O, and H, and is a material whose dielectric constant decreases as it contains more hydrogen (H) or carbon (C), which are atoms with a low electrical polarity in a film.

Subsequently, first and second hard masks 56 and 57 may be sequentially formed over the second dielectric layer 55 in the recited order. The first and second hard masks 56 and 57 may include a material having an etch selectivity with respect to the second dielectric layer 55. The first and second hard masks 56 and 57 may include an easily removable material. The first and second hard masks 56 and 57 may be formed of materials having different etch selectivities. For example, the first hard mask 56 may include tetra ethyl ortho silicate (TEOS), and the second hard mask 56 may include a spin-on-carbon (SOC). The first and second hard masks 56 and 57 may have different thicknesses. The thickness of the first hard mask 56 may be smaller than the thicknesses of the second dielectric layer 55 and the second hard mask 57.

Subsequently, a first anti-reflection layer 58 and a trench mask TM may be formed over the second hard mask 57. The first anti-reflection layer 58 may include a material having an etch selectivity with respect to the first and second hard masks 56 and 57. The first anti-reflection layer 58 may include, for example, silicon oxynitride (SiON). The trench mask TM may include a photoresist. The trench mask TM may define a region where a metal line is to be formed, and the trench mask TM may be patterned in a line shape extending in one direction.

Subsequently, a plurality of trenches TO may be formed in the second dielectric layer 55. The trenches TO are the region where the second metal line is to be formed and the trenches TO may be formed by etching the second dielectric layer 55 to a predetermined depth. The trenches TO may be formed through a series of processes of sequentially etching the first anti-reflection layer 58, the second hard mask 57, and the first hard mask 56 by using the trench mask TM, and then etching the second dielectric layer 55 to a predetermined depth by using the etched second and first hard masks 57 and 56 as an etch barrier. The trench mask TM and the first anti-reflection layer 58 may be removed after the first and second hard masks 56 and 57 are etched, or they may be removed after the trenches TO are formed. The second hard mask 57 may be removed after the trenches TO are formed.

Figure 5C:
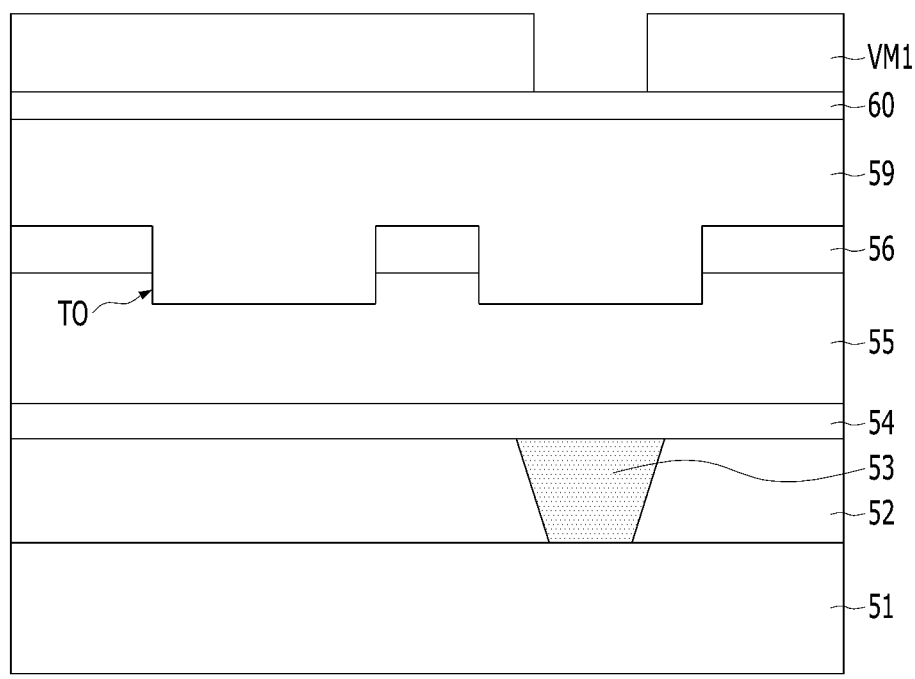
Figure 5D:
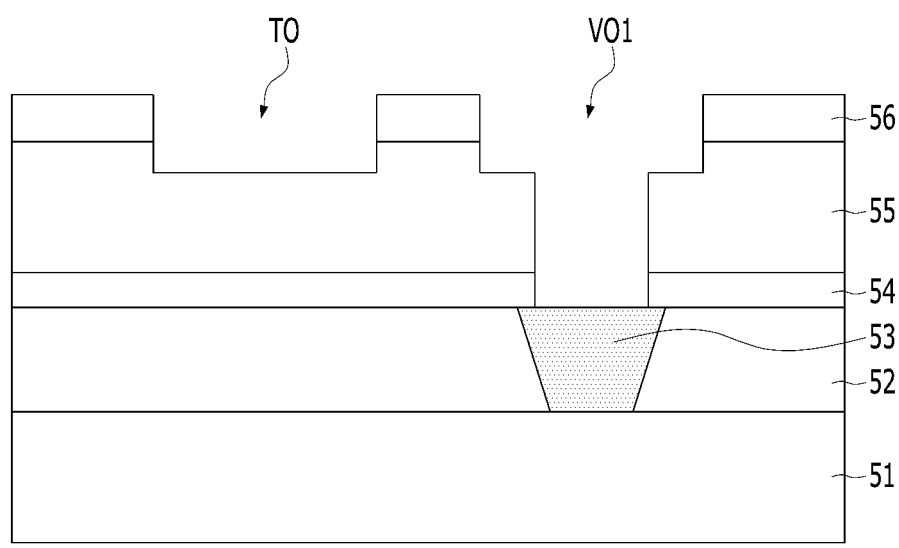

Referring to FIGS. 5C and 5D, a third hard mask 59, a second anti-reflection layer 60, and a first via mask VM1 may be sequentially formed over the trenches TO and the first hard mask 56 in the recited order. The third hard mask 59 may include the same material as that of the second hard mask 57 (refer to FIG. 5A). The third hard mask 59 may include a spin-on-carbon (SOC). The thickness of the third hard mask 59 may be greater than the thickness of the first hard mask 56.

The second anti-reflection layer 60 may include a material having an etch selectivity with respect to the third hard mask 59. The second anti-reflection layer 60 may include, for example, silicon oxynitride (SiON). The first via mask VM1 may include a photoresist. The first via mask VM1 may define a region where a via is to be formed, and the first via mask VM1 may be patterned in a hole shape to form a hole. The area defined by the first via mask VM1 may overlap with the trench TO. The line width of the region defined by the first via mask VM1 may be smaller than the line width of the trench TO.

Subsequently, a via VO1 exposing the upper surface of the first metal line 53 may be formed on the lower surface of the trench TO. The via VO1 may be formed through a series of processes of sequentially etching the second anti-reflection layer 60 and the third hard mask 59 by using the first via mask VM1 as an etch barrier, and then etching the second dielectric layer 55 by using the etched third hard mask 59 as an etch barrier. The first via mask VM1 and the second anti-reflection layer 60 may be removed after the third hard mask 59 is etched, or they may be removed after the via VO1 is formed. The third hard mask 59 may be removed after the via VO1 is formed.

Figure 5E:
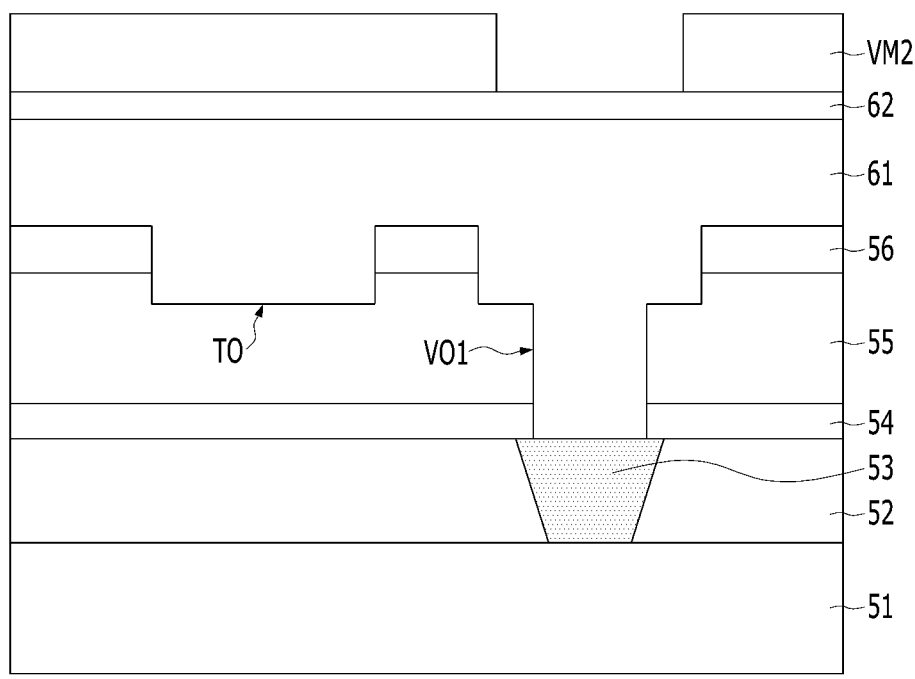
Figure 5F:
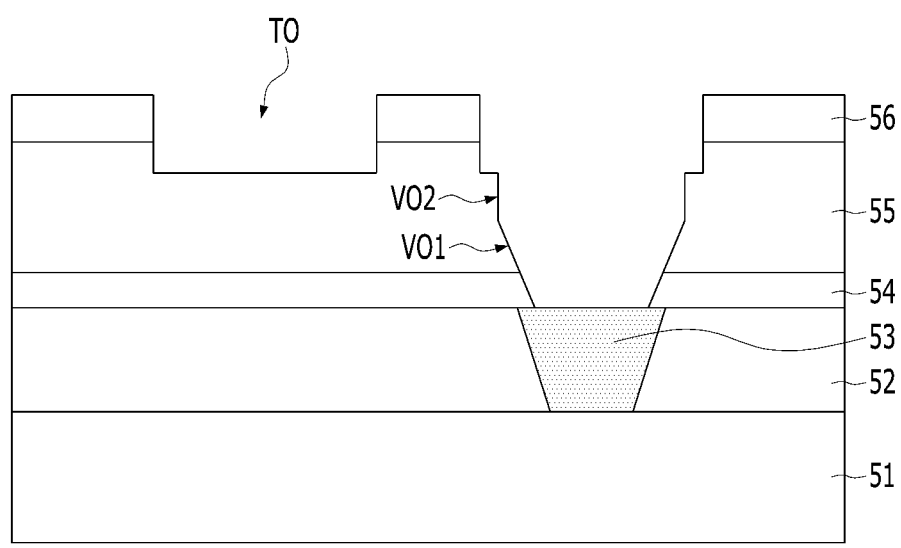

Referring to FIGS. 5E and 5F, a fourth hard mask 61, a third anti-reflection layer 62, and a second via mask VM2 may be sequentially formed over the via VO1 and the first hard mask 56. The fourth hard mask 61 may include the same material as that of the second hard mask 57 (refer to FIG. 5A). The fourth hard mask 61 may include a spin-on-carbon (SOC). The thickness of the fourth hard mask 61 may be greater than the thickness of the first hard mask 56.

The third anti-reflection layer 62 may include a material having an etch selectivity with respect to the fourth hard mask 61. The third anti-reflection layer 62 may include, for example, silicon oxynitride (SiON). The second via mask VM2 may include a photoresist. The second via mask VM2 may be patterned to have a hole shape to form a hole. The region defined by the second via mask VM2 may overlap with the trench TO and the via VO1. The line width of the region defined by the second via mask VM2 may be smaller than the line width of the trench TO and greater than the line width of the via VO1.

Subsequently, a partial via VO2 by increasing a line width of an upper portion of the via VO1 may be formed. The partial via VO2 may include a vertical profile. The via VO1 may include a sloped profile in which a line width of an upper portion is greater than a line width of a lower portion. The via VO1 and the partial via VO2 may have a glass shape including a cylindrical part and a cut cone part.

The partial via VO2 may be formed through a series of processes of sequentially etching the third anti-reflection layer 62 and the fourth hard mask 61 by using the second via mask VM2, and then etching the second dielectric layer 55 of the lower surface of the trench TO by using the etched fourth hard mask 61 as an etch barrier. The etching of the second dielectric layer 55 may be divided into a process of forming the partial via VO2 and a process of expanding the top of the via VO1. The process of forming the partial via VO2 may be performed under the condition that the side of the partial via VO2 has a vertical profile, and the process of expanding the top of the via VO1 may be performed under the condition that the side of the via VO1 has a sloped profile. According to another embodiment of the present invention, the etching process for forming the partial via VO2 and via VO1 may be performed continuously.

The second via mask VM2 and the third anti-reflection layer 62 may be removed after the fourth hard mask 61 is etched or they may be removed after the partial via VO2 is formed. The fourth hard mask 61 may be removed after the partial via VO2 is formed, or the fourth hard mask 61 may be removed after an upper portion of the partial via VO2 is formed. The via VO1 and the partial via VO2 may be referred to as a 'double via'. The double via may also be referred to as a 'metal line contact hole' that couples between metal lines.

Figure 5G:
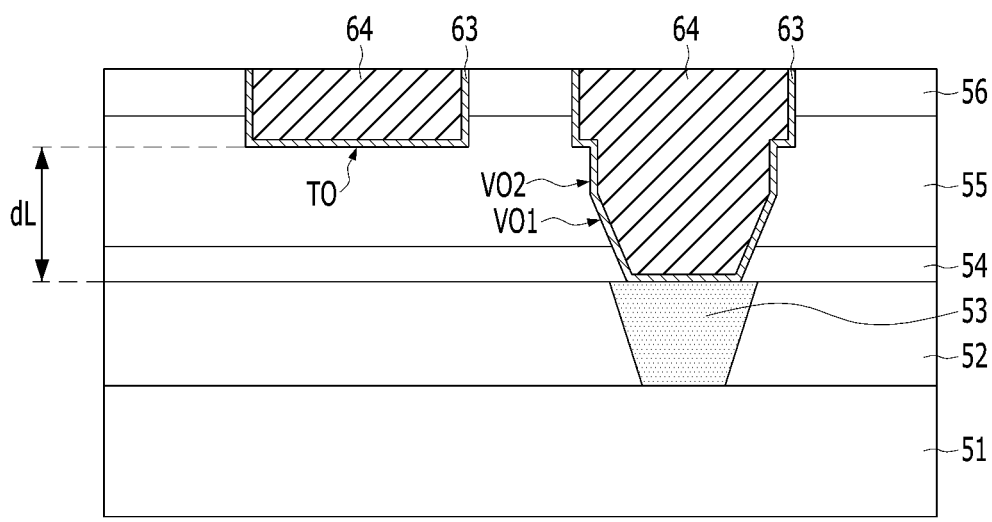

Referring to FIG. 5G, a second metal line 64 may be formed. The second metal line 64 may be formed through a series of processes of forming a barrier layer 63 on the profile of the second dielectric layer 55 including the via VO1, the partial via VO2 and the trench TO, forming a conductive material that fills the via VO1, the partial via VO2 and the trench TO over the barrier layer 63, and then etching the conductive material and the barrier layer 63 to expose the upper surface of the second dielectric layer 55. In this case, the process of etching the conductive material and the barrier layer 63 may be performed by Chemical Mechanical Polishing (CMP) or an etch-back process.

The barrier layer 63 may serve to prevent diffusion of the second metal line 64. The barrier layer 63 may be formed of at least one material selected from the group including Ta, TaN, TiN, WN, and W—Si—N. The second metal line 64 may include, for example, tungsten, copper, or aluminum.

According to the embodiment of the present invention, the line width may increase in a stepwise manner as it goes up from a lower surface of the via VO1, toward the partial via VO2 and then to the trench TO. In other words, by applying a the partial via VO2 larger than the line width of the bottom of the via VO1 and smaller than the line width of the trench between the via VO1 and the trench TO, the aspect ratio of the via may be reduced and the contact area between the via and the metal line may be increased. Accordingly, it may be possible to secure a gap-fill margin when the conductive material for the metal line ML is filled, thereby improving the problem of voids being formed. Also, it may be possible to secure an overlap margin between the via VO1 and the metal line ML.

Furthermore, according to the embodiment of the present invention, by applying a double via including the via VO1 and the partial via VO2 under the second metal line 64, the distance dL from the first metal line 53 may be increased. Accordingly, parasitic capacitance between the first metal line 53 and the second metal line 64 may be improved, which may lead to improvement in memory operation characteristics.

FIGS. 6A to 6G are cross-sectional views illustrating another embodiment of a method for fabricating the semiconductor device shown in FIG. 2.

Figure 6A:
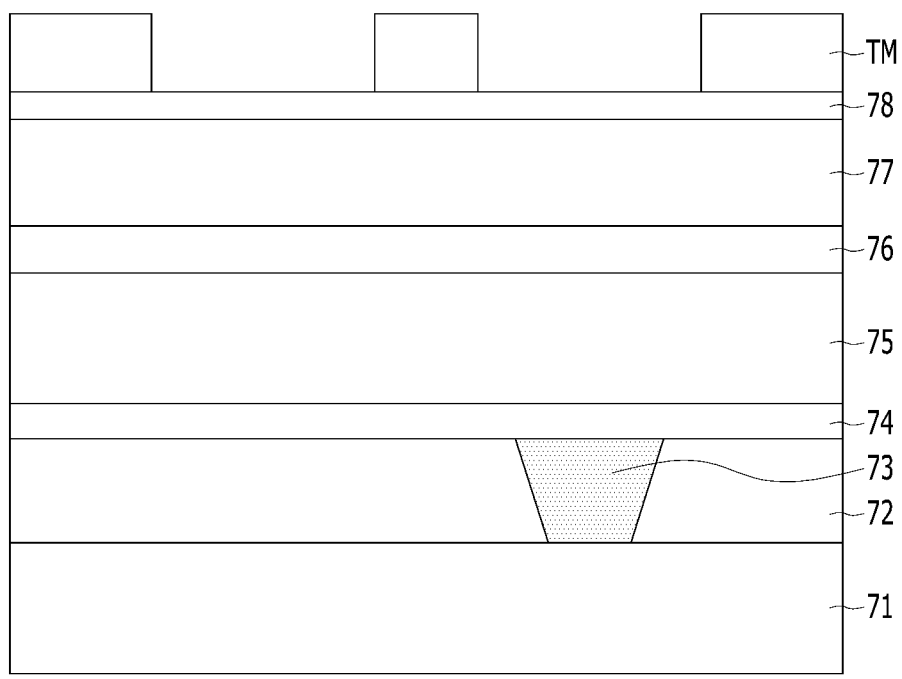
FIGS. 6A to 6G are cross-sectional views illustrating another embodiment of a method for fabricating the semiconductor device shown in FIG. 2.
Figure 6B:
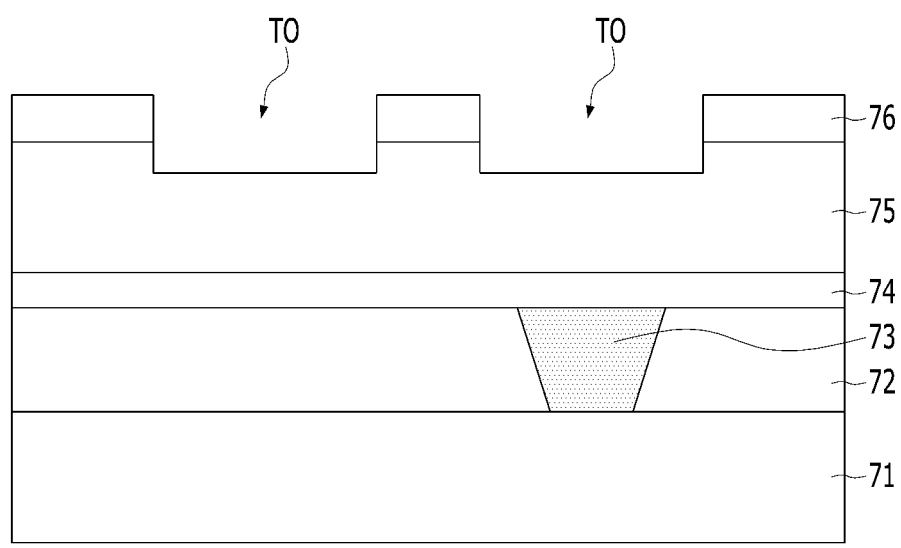

Referring to FIGS. 6A and 6B, the first dielectric layer 72 in which the buried first metal line 73 may be formed over the semiconductor substrate 71.

The semiconductor substrate 71 may be a semiconductor substrate in which a lower structure such as a gate, a bit line, and a capacitor is formed. The semiconductor substrate 71 may be formed of a material containing silicon. For example, the semiconductor substrate 71 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate 71 may include a III/V group semiconductor substrate, for example, a compound semiconductor substrate such as GaAs. The semiconductor substrate 71 may include a silicon-on-insulator (SOI) substrate.

The first dielectric layer 72 may be formed of at least one of silicon oxide, silicon nitride, and low-k materials including silicon carbon and boron.

The first metal line 73 may include a conductive material. The first metal line 73 may include a metal material. The first metal line 73 may include, for example, tungsten, copper, or aluminum.

Subsequently, an etch stop layer 74 may be formed over the first dielectric layer 72 including the first metal line 73. The etch stop layer 74 may also serve as a barrier to prevent diffusion of the first metal line 73. The etch stop layer 74 may include, for example, silicon nitride or silicon carbon.

Subsequently, a second dielectric layer 75 may be formed over the etch stop layer 74. The thickness of the second dielectric layer 75 may be greater than the thickness of the etch stop layer 74. The second dielectric layer 75 may be a low-k dielectric layer having a low dielectric constant. The second dielectric layer 75 may be formed of a dielectric material having a lower dielectric constant than that of silicon oxide ($SiO_2$), preferably a material having a dielectric constant of approximately 3.5 or less. The second dielectric layer 75 may be a low dielectric layer containing carbon. The second dielectric layer 75 may include silicon oxide containing carbon and hydrogen. The second dielectric layer 75 may be, for example, SiCOH. SiCOH is a mixture of Si, C, O, and H, and SiCOH is a material whose dielectric constant decreases as it contains more hydrogen (H) or carbon (C), which are atoms with a low electrical polarity in a film.

Subsequently, first and second hard masks 76 and 77 may be formed sequentially over the second dielectric layer 75 in the recited order. The first and second hard masks 76 and 77 may include a material having an etch selectivity with respect to the second dielectric layer 75. The first and second hard masks 76 and 77 may include an easily removable material. The first and second hard masks 76 and 77 may be formed of materials having different etch selectivities. For example, the first hard mask 76 may include tetra ethyl ortho silicate (TEOS), and the second hard mask 76 may include a spin-on-carbon (SOC). The first and second hard masks 76 and 77 may have different thicknesses. The thickness of the first hard mask 76 may be smaller than the thicknesses of the second dielectric layer 75 and the second hard mask 77.

Subsequently, a first anti-reflection layer 78 and a trench mask TM may be formed over the second hard mask 77. The first anti-reflection layer 78 may include a material having an etch selectivity with respect to the first and second hard masks 76 and 77. The first anti-reflection layer 78 may include, for example, silicon oxynitride (SiON). The trench mask TM may include a photoresist. The trench mask TM may define the region where a metal line is to be formed, and the trench mask TM may be patterned in a line shape extending in one direction.

Subsequently, a plurality of trenches TO may be formed in the second dielectric layer 75. The trenches TO may be the region where the second metal line is formed and the trenches TO may be formed by etching the second dielectric layer 75 to a predetermined depth. The trenches TO may be formed through a series of processes of sequentially etching the first anti-reflection layer 78, the second hard mask 77, and the first hard mask 76 by using the trench mask TM, and then etching the second dielectric layer 75 to a predetermined depth by using the etched second and first hard masks 77 and 76 as an etch barrier. The trench mask TM and the first anti-reflection layer 78 may be removed after the first and second hard masks 76 and 77 are removed, or they may be removed after the trenches TO are formed. The second hard mask 77 may be removed after the trenches TO are formed.

Figure 6C:
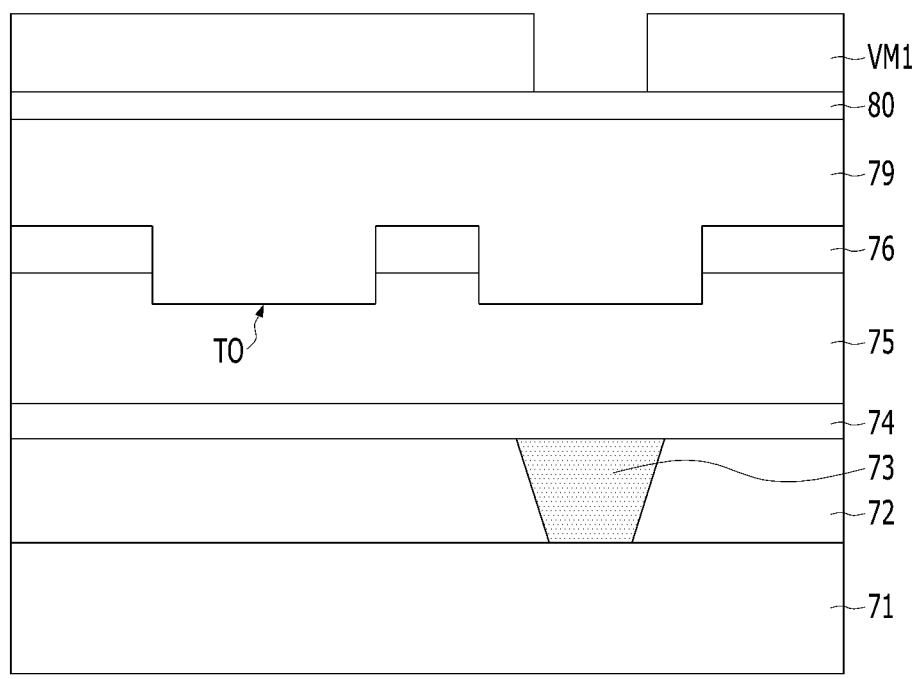
Figure 6D:
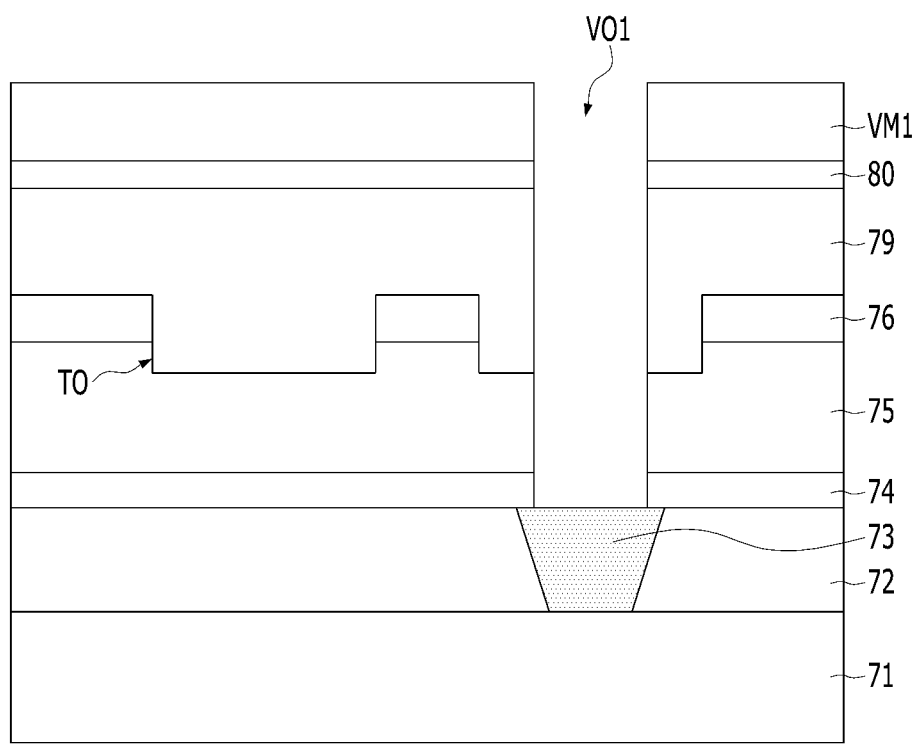

Referring to FIGS. 6C and 6D, a third hard mask 79, a second anti-reflection layer 80, and a first via mask VM1 may be sequentially formed over the trenches TO and the first hard mask 76 in the recited order. The third hard mask 79 may include the same material as that of the second hard mask 77 (refer to FIG. 6A). The third hard mask 79 may include a spin-on-carbon (SOC). The thickness of the third hard mask 79 may be greater than the thickness of the first hard mask 76.

The second anti-reflection layer 80 may include a material having an etch selectivity with respect to the third hard mask 79. The second anti-reflection layer 80 may include, for example, silicon oxynitride (SiON). The first via mask VM1 may include a photoresist. The first via mask VM1 may define the region where a via is to be formed, and it may be patterned in a hole shape to form a hole. The area defined by the first via mask VM1 may overlap with the trench TO. The line width of the region defined by the first via mask VM1 may be smaller than the line width of the trench TO.

Subsequently, a via VO1 exposing the upper surface of the first metal line 73 may be formed on the lower surface of the trench TO. The via VO1 may be formed through a series of processes of sequentially etching the second anti-reflection layer 80 and the third hard mask 79 by using the first via mask VM1, and then etching the second dielectric layer 75 by using the etched third hard mask 79 as an etch barrier. The first via mask VM1 and the second anti-reflection layer 80 may be removed after the third hard mask 79 is etched or they may be removed after the via VO1 is formed.

Figure 6E:
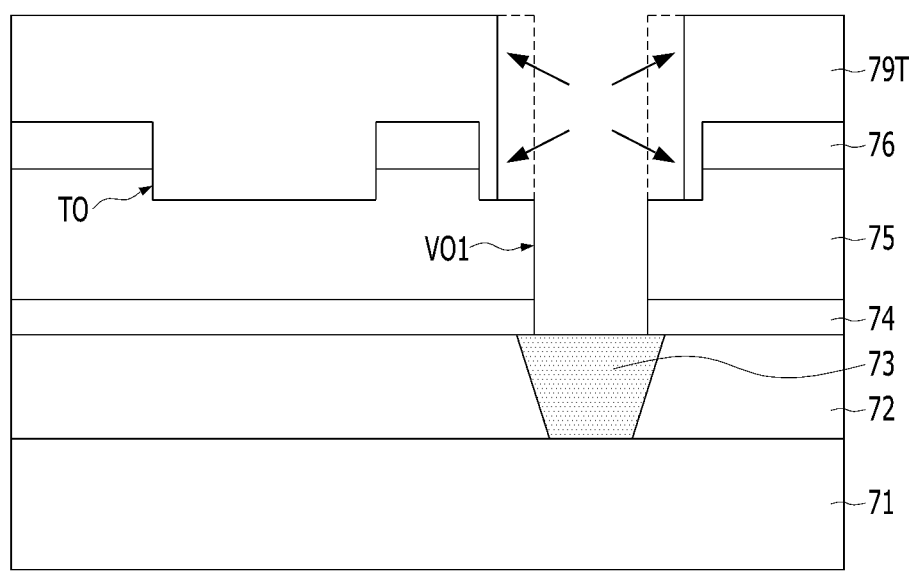
Figure 6F:
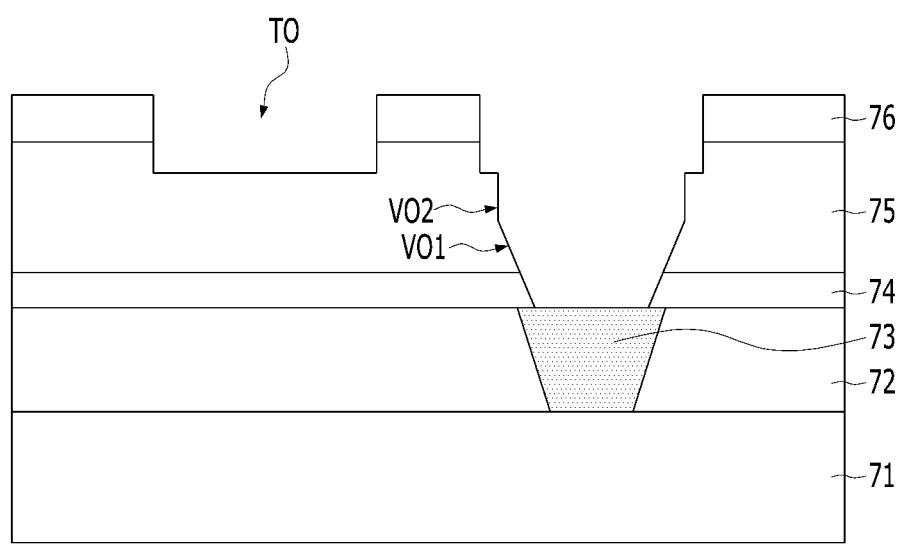

Referring to FIGS. 6E and 6F, the third hard mask 79 may be trimmed. Hereinafter, the trimmed third hard mask will be denoted by a reference numeral 79T. The line width of the region defined by the third hard mask 79T may be adjusted to be smaller than the line width of the trench TO. Accordingly, a portion of the lower surface of the trench TO may be exposed by the third hard mask 79T.

Subsequently, the second dielectric layer 75 on the exposed lower surface of the trench TO may be etched. As a result, a partial via VO2 by increasing a line width of an upper portion of the via VO1 may be formed. The partial via VO2 may include a vertical profile. The via VO1 may include a sloped profile in which a line width of an upper portion is greater than a line width of a lower portion. The via VO1 and the partial via VO2 may have a glass shape including a cylindrical shape and a cut cone shape. According to another embodiment of the present invention, the partial via VO2 and the via VO1 may be formed in an inverted trapezoidal shape having a slop profile.

The etching of the second dielectric layer 75 may be divided into a process of forming the partial via VO2 and a process of expanding the top of the via VO1. The process of forming the partial via VO2 may be performed under the condition that the side of the partial via VO2 has a vertical profile, and the process of expanding the top of the via VO1 may be performed under the condition that the side of the via VO1 has a slop profile. According to another embodiment of the present invention, the etching process for forming the partial via VO2 and via VO1 may be performed continuously. The third hard mask 79T may be removed after the partial via VO2 is formed. The via VO1 and the partial via VO2 may be referred to as a 'double via'. The double via may also be referred to as a 'metal line contact hole' that couples between metal lines.

Figure 6G:
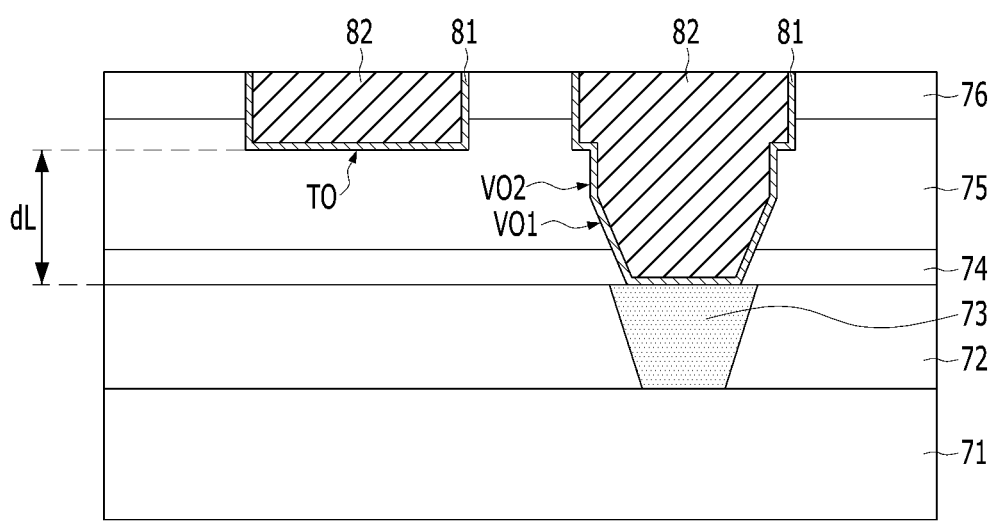

Referring to FIG. 6G, a second metal line 82 may be formed. The second metal line 82 may be formed through a series of processes of forming a barrier layer 81 on the profile of the second dielectric layer 75 including the via VO1, the partial via VO2 and the trench TO, forming a conductive material that fills the via VO1, the partial via VO2 and the trench TO over the barrier layer 81, and then etching the conductive material and the barrier layer 81 to expose the upper surface of the second dielectric layer 75. In this case, the process of etching the conductive material and the barrier layer 81 may be performed by Chemical Mechanical Polishing (CMP) or an etch-back process.

The barrier layer 81 may serve to prevent diffusion of the second metal line 82. The barrier layer 81 may be formed of at least one material selected from the group including Ta, TaN, TiN, WN, and W—Si—N. The second metal line 82 may include, for example, tungsten, copper, or aluminum.

According to the embodiment of the present invention, the line width may be increased in a stepwise manner as it goes up toward the via VO1, the partial via VO2 and the trench TO. In other words, by applying the partial via VO2 larger than the line width of the bottom of the via VO1 and smaller than the line width of the trench between the via VO1 and the trench TO, the aspect ratio of the via may be reduced and the contact area between the via and the metal line may be increased. Accordingly, it may be possible to secure a gap-fill margin when the conductive material for the metal line ML is filled, thereby improving the problem of voids being formed. Also, it may be possible to secure an overlap margin between the via VO1 and the metal line ML.

Furthermore, according to the embodiment of the present invention, by applying a double via including the via VO1 and the partial via VO2 under the second metal line 82, the distance dL from the first metal line 73 may be increased. Accordingly, parasitic capacitance between the first metal line 73 and the second metal line 82 may be improved, which may lead to improvement in memory operation characteristics.

According to the embodiment of the present invention, the reliability of the semiconductor device may be improved by improving the burial of the metal lines by applying double vias having different line widths.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a dielectric layer over a substrate;
    forming a hole-shaped partial via in the dielectric layer;
    forming a line-shaped trench in the dielectric layer including the partial via that partially overlaps with the partial via and has a greater line width than a line width of the partial via in the dielectric layer;
    forming a hole-shaped via that has a smaller line width than the line width of the partial via and penetrates the dielectric layer including the partial via and the trench on a lower surface of the partial via; and
    gap-filling the via, the partial via and the trench with a conductive material,
    wherein a lower surface of the trench is positioned at a higher level than the lower surface of the partial via,
    wherein the dielectric layer is a single layer.

2. The method of claim 1, wherein the forming of the hole-shaped partial via in the dielectric layer includes:
    forming a hole-shaped hard mask over the dielectric layer; and
    etching the dielectric layer to a predetermined depth to form the partial via by using the hard mask as an etch barrier.

3. The method of claim 1, wherein the via and the partial via include at least one of a cylindrical, polygonal, and cut cone shapes.

4. The method of claim 2, wherein the hard mask includes a Spin-on-Carbon (SOC).

5. The method of claim 1, wherein the dielectric layer includes a low-k material having a lower dielectric constant than silicon oxide.

6. The method of claim 1, wherein the dielectric layer includes silicon oxide containing carbon and hydrogen.

7. The method of claim 1, further comprising:
    forming a barrier layer, before the gap-filling of the via, the partial via and the trench with the conductive material.

8. The method of claim 1, wherein the conductive material includes copper, tungsten, and aluminum.

9. A method for fabricating a semiconductor device, comprising:
    forming a dielectric layer over a substrate;
    forming a line-shaped trench that extends in one direction in the dielectric layer;
    forming a hole-shaped partial via that overlaps with a portion of the trench and has a smaller line width than a line width of the trench in the dielectric layer on a lower surface of the trench;
    forming a hole-shaped via that penetrates the dielectric layer on a lower surface of the partial via and has a smaller line width than the line width of the partial via; and
    gap-filling the via, the partial via, and the trench with a conductive material,
    wherein the dielectric layer is a single layer.

10. The method of claim 9, wherein the via and the partial via include at least one of a cylindrical, polygonal, and cut cone shapes.

11. The method of claim 9, wherein the dielectric layer includes a low-k material having a lower dielectric constant than silicon oxide.

12. The method of claim 9, wherein the dielectric layer includes silicon oxide containing carbon and hydrogen.

13. The method of claim 9, further comprising:
    forming a barrier layer, before the gap-filling of the via, the partial via and the trench with the conductive material.

14. The method of claim 9, wherein the conductive material includes copper, tungsten, and aluminum.

15. A method for fabricating a semiconductor device, comprising:
    forming a dielectric layer over a substrate;
    forming a line-shaped trench that extends in one direction in the dielectric layer;
    forming a hole-shaped via in the dielectric layer that penetrates the dielectric layer on a lower surface of the trench and has a smaller line width than a line width of the trench;
    forming a partial via by increasing a line width of an upper portion of the via; and gap-filling the via, the partial via, and the trench with a conductive material,
wherein the dielectric layer is a single layer.

16. The method of claim 15, wherein the forming of the partial via by increasing the line width of the upper portion of the via includes:
   forming a hard mask over the dielectric layer including the via and the trench;
   forming a hole-shaped partial via mask that overlaps with the via and has a greater line width than a line width of the via over the hard mask;
   etching the hard mask by using the partial via mask; and
   etching the dielectric layer on the lower surface of the trench that overlaps with the via by using the hard mask to a predetermined depth.

17. The method of claim 15, wherein the forming of the hole-shaped via that penetrates the dielectric layer on the lower surface of the trench and has the smaller line width than the line width of the trench includes:
   forming a hard mask over the dielectric layer including the trench;
   forming a hole-shaped via mask that overlaps with a portion of the trench and has a smaller line width than the line width of the trench over the hard mask;
   etching the hard mask by using the via mask; and
   etching the dielectric layer on the lower surface of the trench by using the hard mask.

18. The method of claim 17, wherein the forming of the partial via by increasing the line width of the upper portion of the via includes:
   trimming the hard mask over the via; and
   etching the dielectric layer of the lower surface of the trench to a predetermined depth by using the trimmed hard mask.

19. The method of claim 17, wherein the hard mask includes a Spin-on-Carbon (SOC).

20. The method of claim 15, wherein a line width of the partial via is larger than a line width of the lower surface of the via and smaller than the line width of the trench.

21. The method of claim 15, wherein the partial via has a vertical profile, and
   the via has a sloped profile in which the line width of the upper portion of the via is greater than a line width of a lower portion.

22. The method of claim 15, wherein the dielectric layer includes a low-k material having a lower dielectric constant than silicon oxide.

23. The method of claim 15, wherein the dielectric layer includes silicon oxide containing carbon and hydrogen.

24. The method of claim 15, further comprising:
   forming a barrier layer, before the gap-filling of the via, the partial via and the trench with the conductive material.

25. The method of claim 15, wherein the conductive material includes copper, tungsten, and aluminum.

* * * * *